United States Patent
Maruko et al.

(10) Patent No.: US 10,113,217 B2
(45) Date of Patent: Oct. 30, 2018

(54) PLATINUM THERMOCOUPLE WIRE

(71) Applicant: FURUYA METAL CO., LTD., Toshima-ku, Tokyo (JP)

(72) Inventors: Tomohiro Maruko, Tokyo (JP); Tomoaki Miyazawa, Tokyo (JP); Shoji Saito, Tokyo (JP); Kensuke Morita, Tokyo (JP)

(73) Assignee: FURUYA METAL CO., LTD., Tokyo (JP)

( * ) Notice: Subject to any disclaimer, the term of this patent is extended or adjusted under 35 U.S.C. 154(b) by 214 days.

(21) Appl. No.: 15/128,826

(22) PCT Filed: Feb. 6, 2015

(86) PCT No.: PCT/JP2015/053379
§ 371 (c)(1),
(2) Date: Sep. 23, 2016

(87) PCT Pub. No.: WO2015/151581
PCT Pub. Date: Oct. 8, 2015

(65) Prior Publication Data
US 2017/0101700 A1    Apr. 13, 2017

(30) Foreign Application Priority Data

Apr. 4, 2014 (JP) .................. 2014-077429
Feb. 4, 2015 (JP) .................. 2015-020084

(51) Int. Cl.
*C22C 5/04* (2006.01)
*C22F 1/14* (2006.01)
*H01L 35/20* (2006.01)

(52) U.S. Cl.
CPC .................. *C22C 5/04* (2013.01); *C22F 1/14* (2013.01); *H01L 35/20* (2013.01)

(58) Field of Classification Search
CPC ............... C22C 5/04; C22F 1/14; H01L 35/20
USPC ....................................... 420/466
See application file for complete search history.

(56) References Cited

U.S. PATENT DOCUMENTS

| 3,640,705 A * | 2/1972 | Selman ..................... C22C 5/00 |
| | | 420/466 |
| 2009/0297389 A1* | 12/2009 | Hasegawa ................. C22C 5/04 |
| | | 420/466 |
| 2009/0323765 A1* | 12/2009 | Yokoi ...................... G01K 1/08 |
| | | 374/185 |
| 2014/0021043 A1 | 1/2014 | Miyashita et al. |
| 2014/0255247 A1* | 9/2014 | Kralik ...................... C22C 5/04 |
| | | 420/466 |
| 2014/0328374 A1 | 11/2014 | Yamasaki et al. |
| 2016/0231181 A1* | 8/2016 | Maruko .................. H01L 35/02 |

FOREIGN PATENT DOCUMENTS

| JP | 2010032493 A | 2/2010 |
| JP | 2012-214874 A | 11/2012 |
| JP | 2013-104705 A | 5/2013 |
| KR | 20090129275 A | 12/2009 |

OTHER PUBLICATIONS

International Preliminary Report on Patentability dated Oct. 13, 2016 from corresponding PCT application No. PCT/JP2015/053379, 6 pages.
Korean Office Action in the corresponding Korean application No. KR 10-2016-7027113, 6 pages, dated Jul. 10, 2017.
International Search Report dated Mar. 10, 2015 from corresponding International PCT Application No. PCT/JP2015/053379, 1 page.
Search Report dated Mar. 10, 2015 from corresponding International PCT Application No. PCT/JP2015/053379, 3 pages.

* cited by examiner

*Primary Examiner* — Helene Klemanski
(74) *Attorney, Agent, or Firm* — Ohland, Greeley, Ruggiero & Perle, L.L.P.

(57) ABSTRACT

A platinum wire in which crystal grain growth is slowed in order to prevent damage caused by creep without dispersing a metal oxide, and occurrence of slip at crystal grain boundaries is slowed. A platinum thermocouple wire that is used in a negative electrode of a platinum-based thermocouple and has a nitrogen mass concentration of 10 to 100 ppm, and when structure observation of the cross section of the wire in a longitudinal direction is performed, a structure is observed in which there is a plurality of crystal grains, which have an aspect ratio {(length of major axis)/(length of minor axis perpendicular to major axis)} of 5 or more and elongate in the longitudinal direction of the wire, in a wire thickness direction.

4 Claims, 30 Drawing Sheets

[FIG. 1]
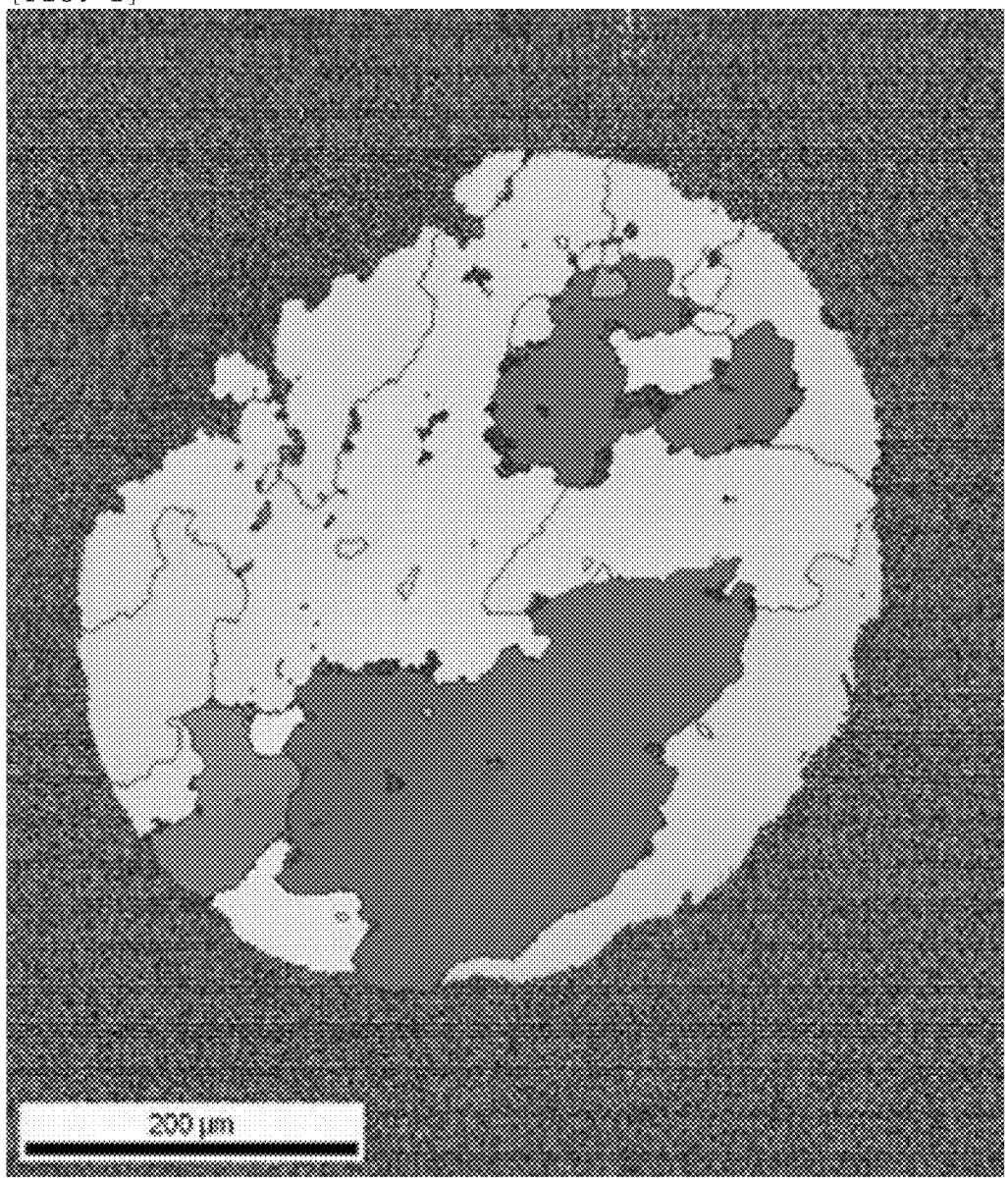

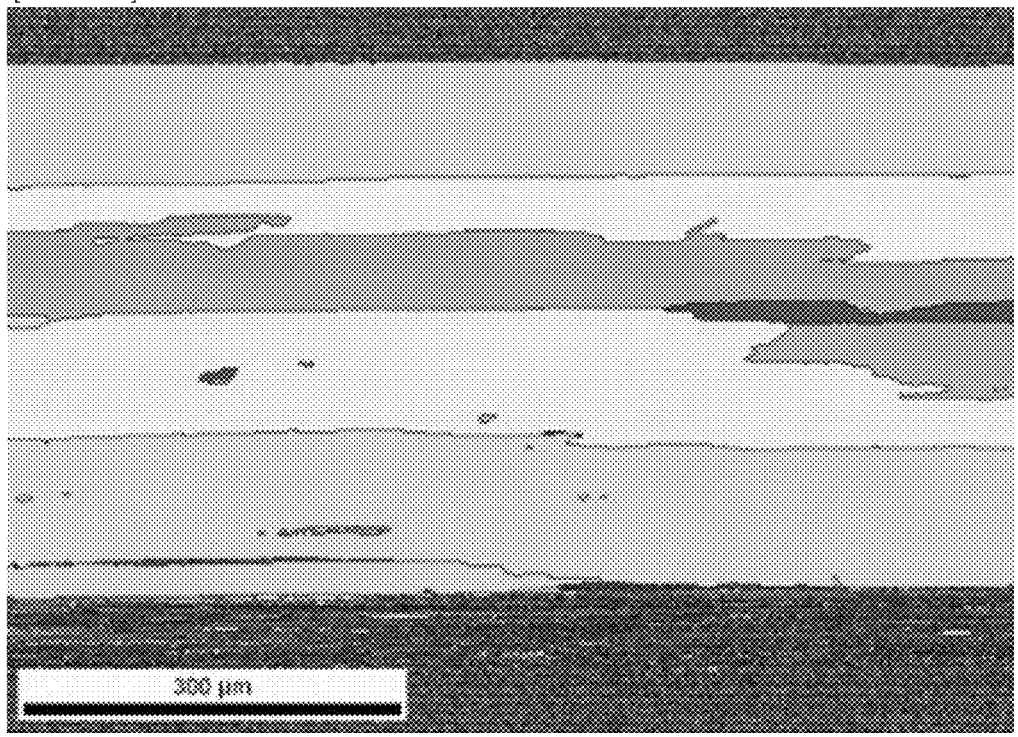
[FIG. 2]

[FIG. 3]
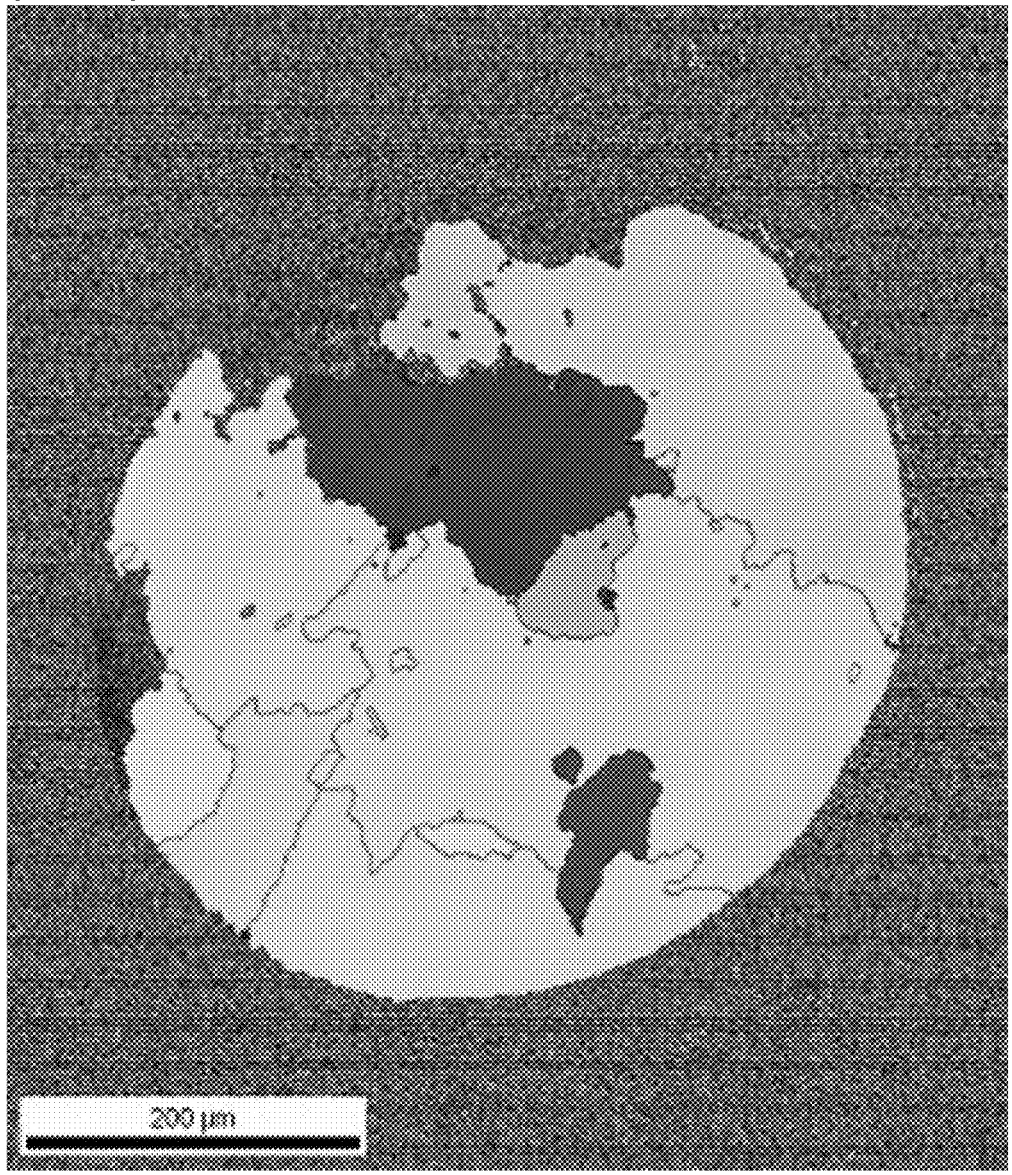

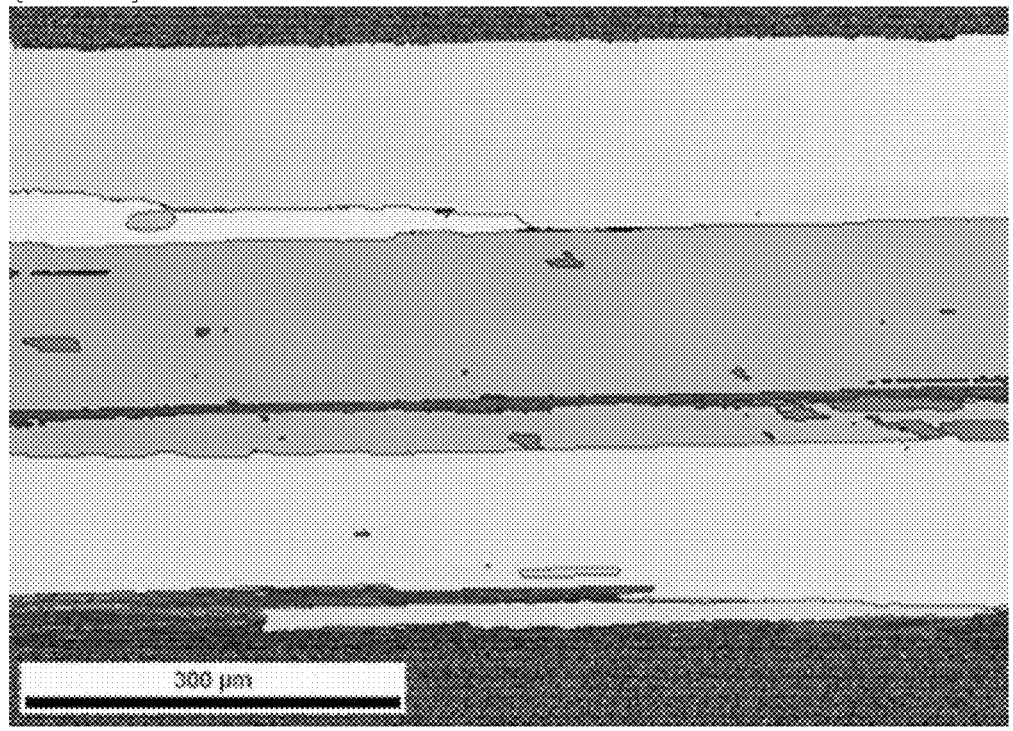
[FIG. 4]

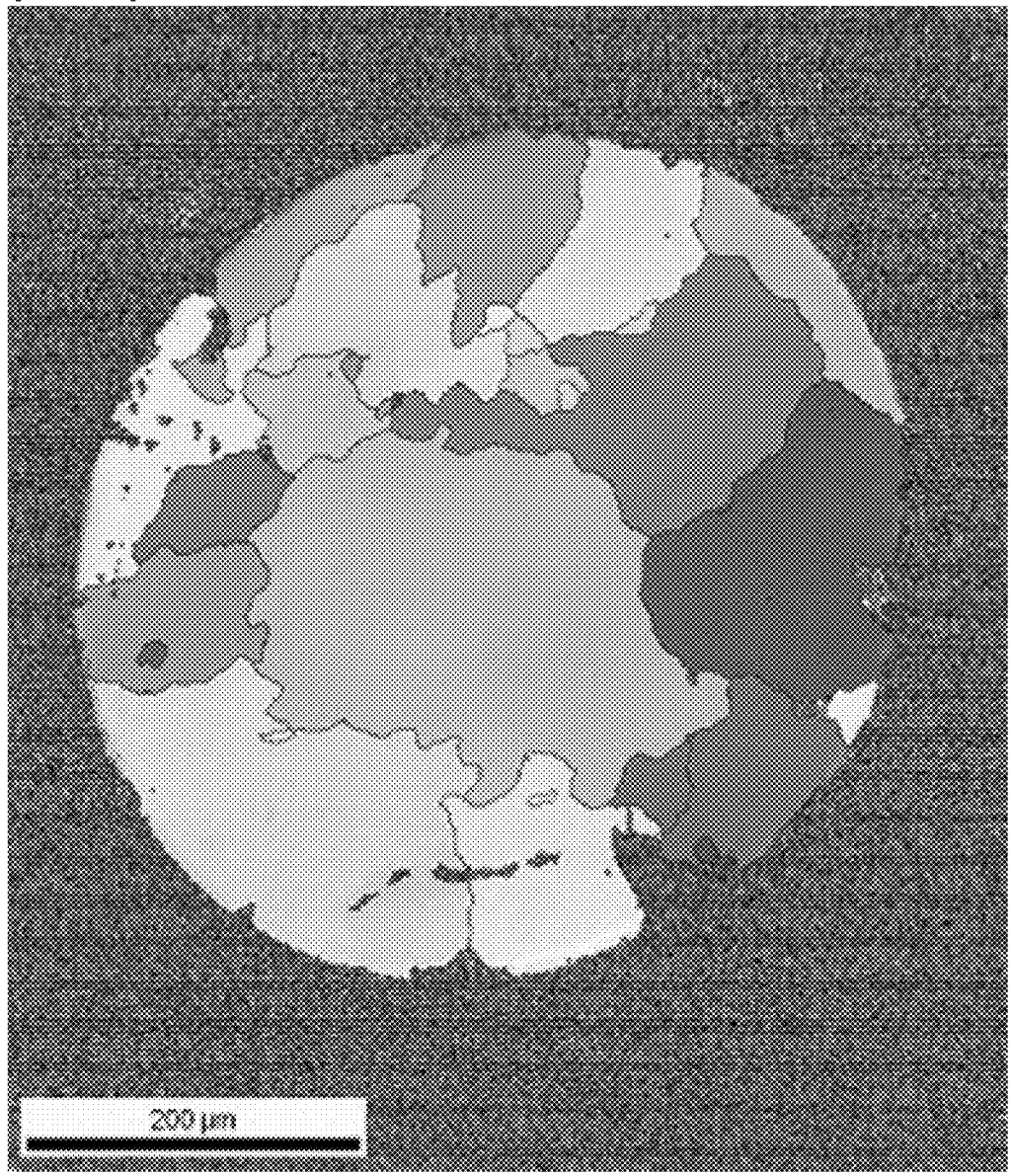
[FIG. 5]

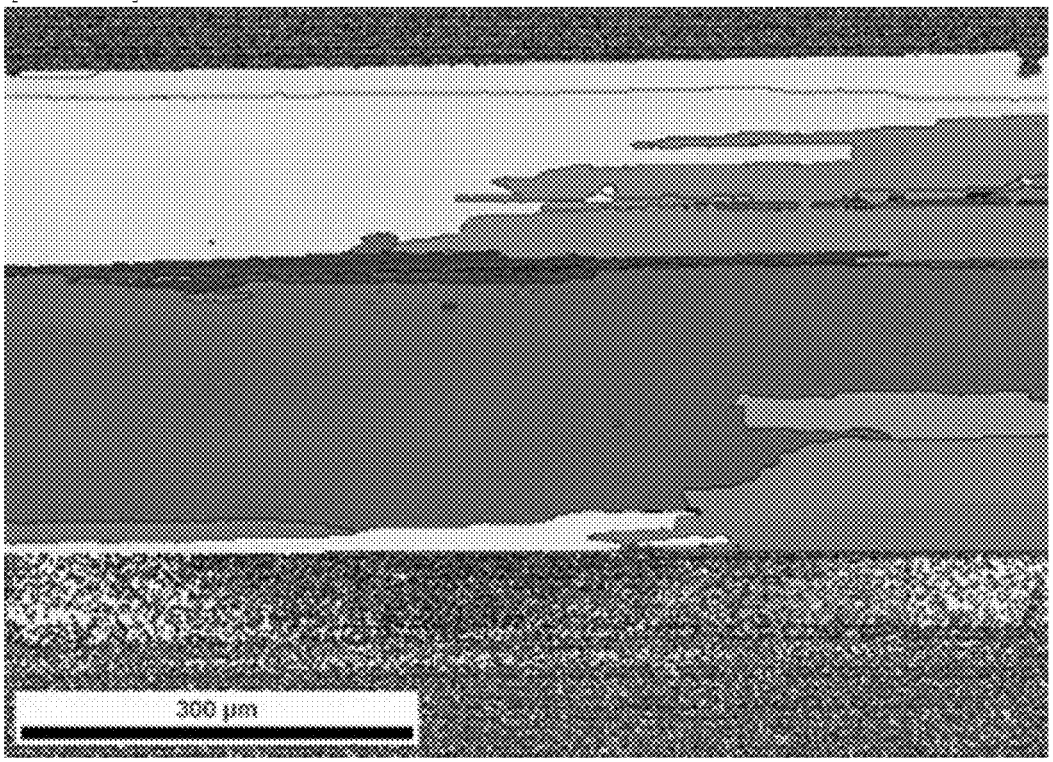
[FIG. 6]

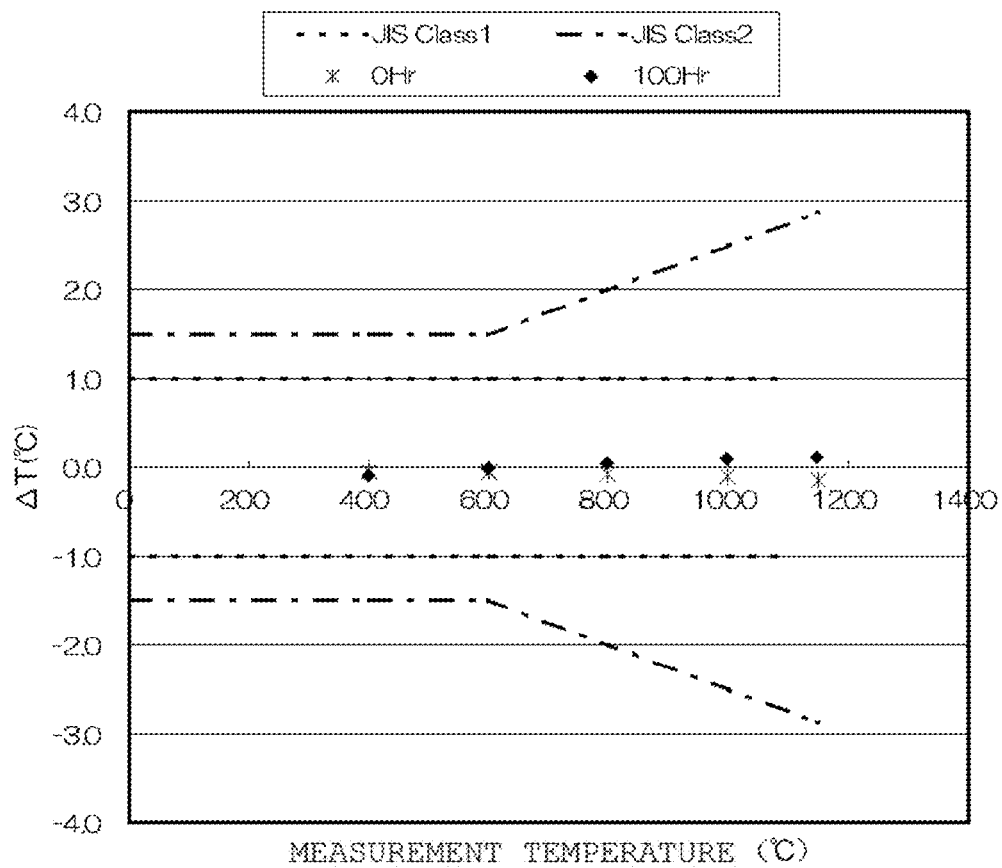

[FIG. 8]
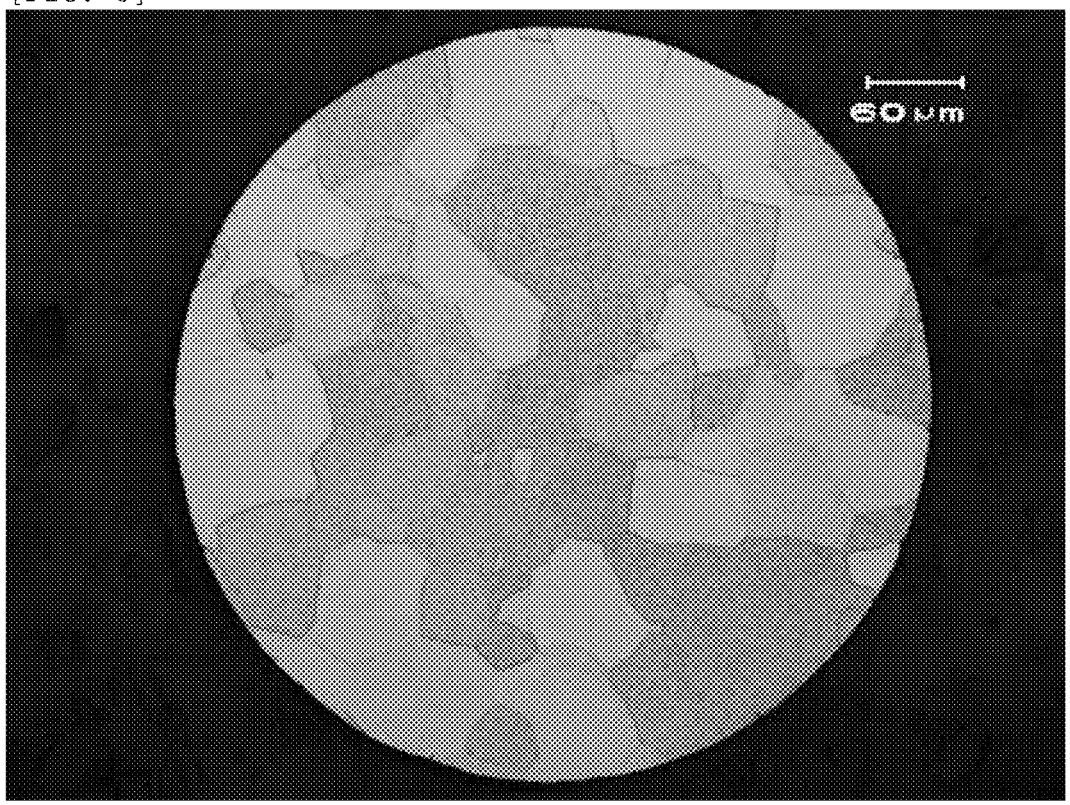

[FIG. 9]
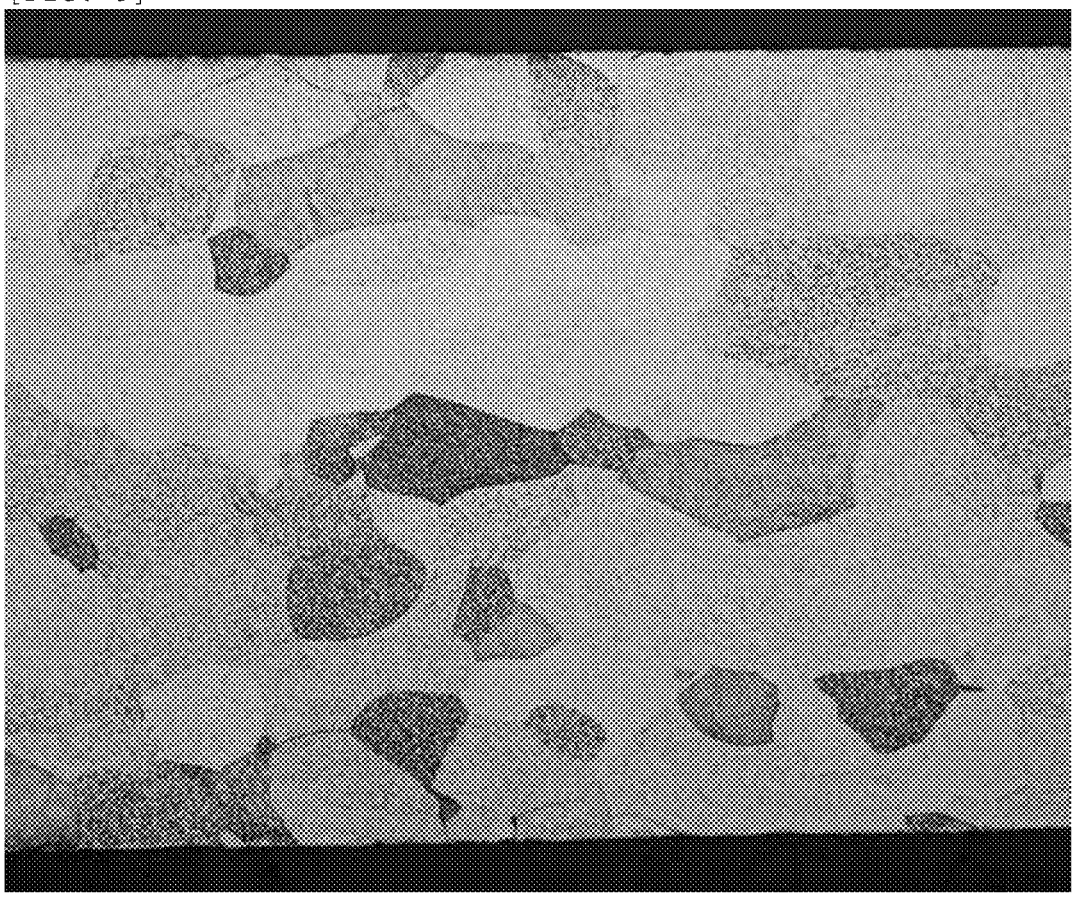

[FIG. 10]
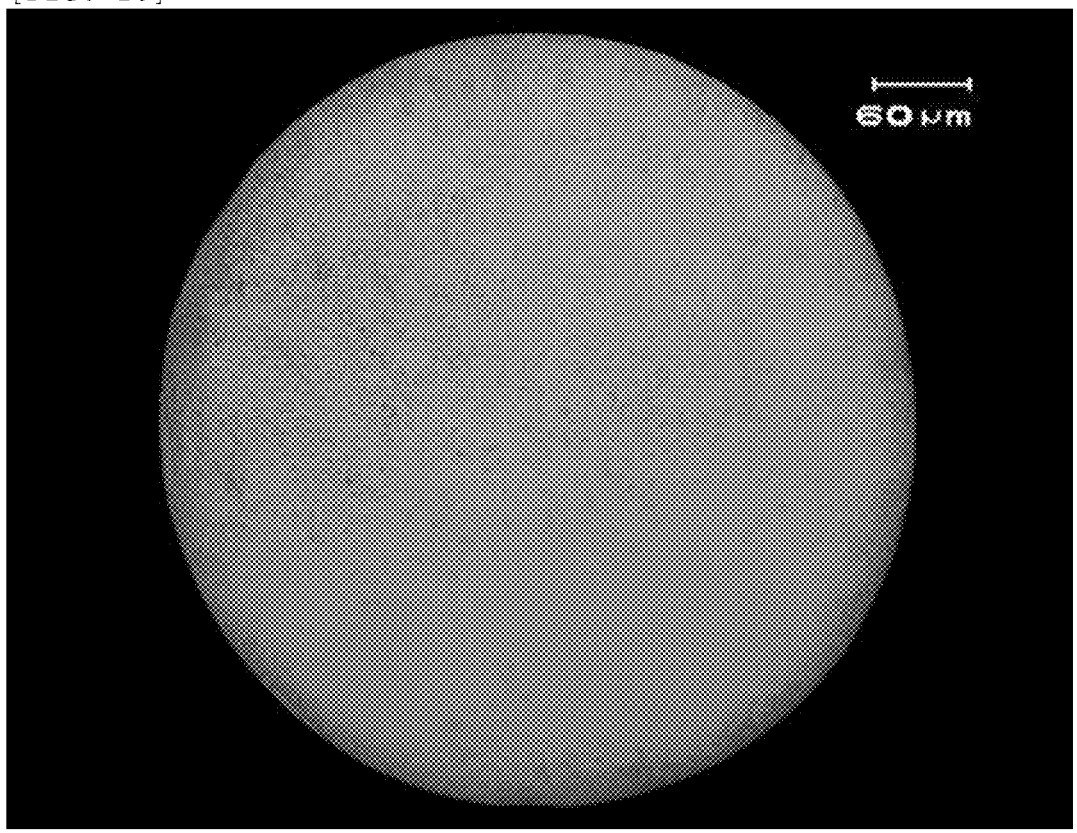

[FIG. 11]
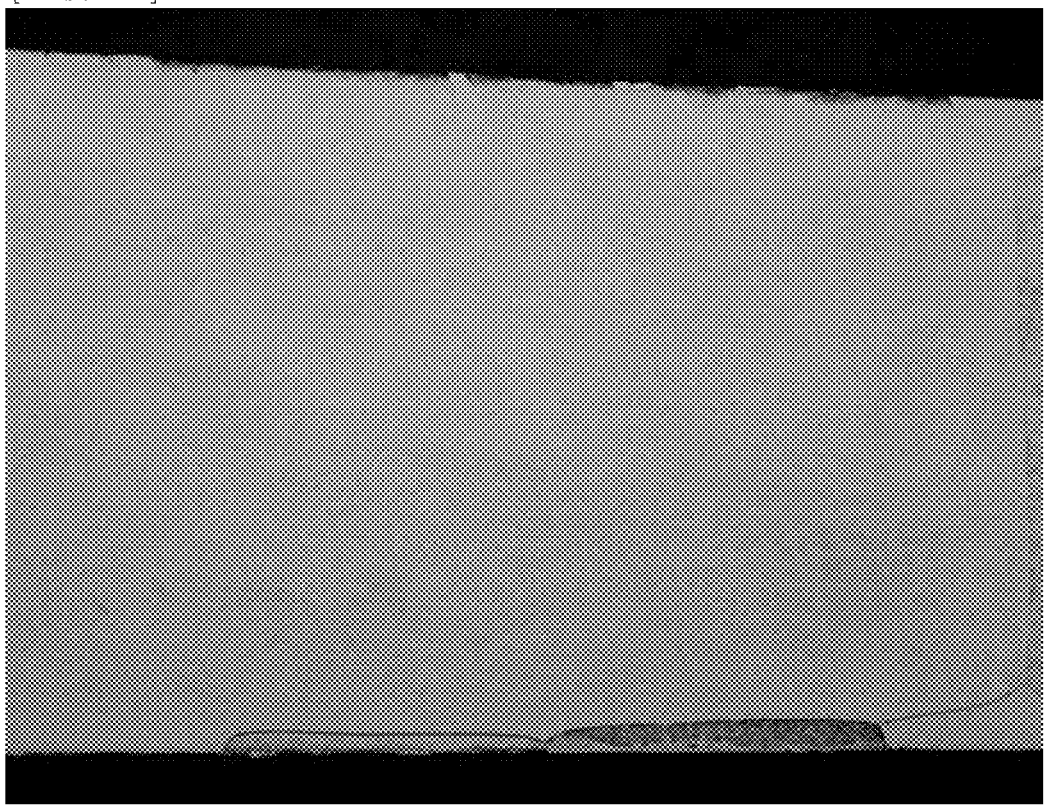

[FIG. 12]
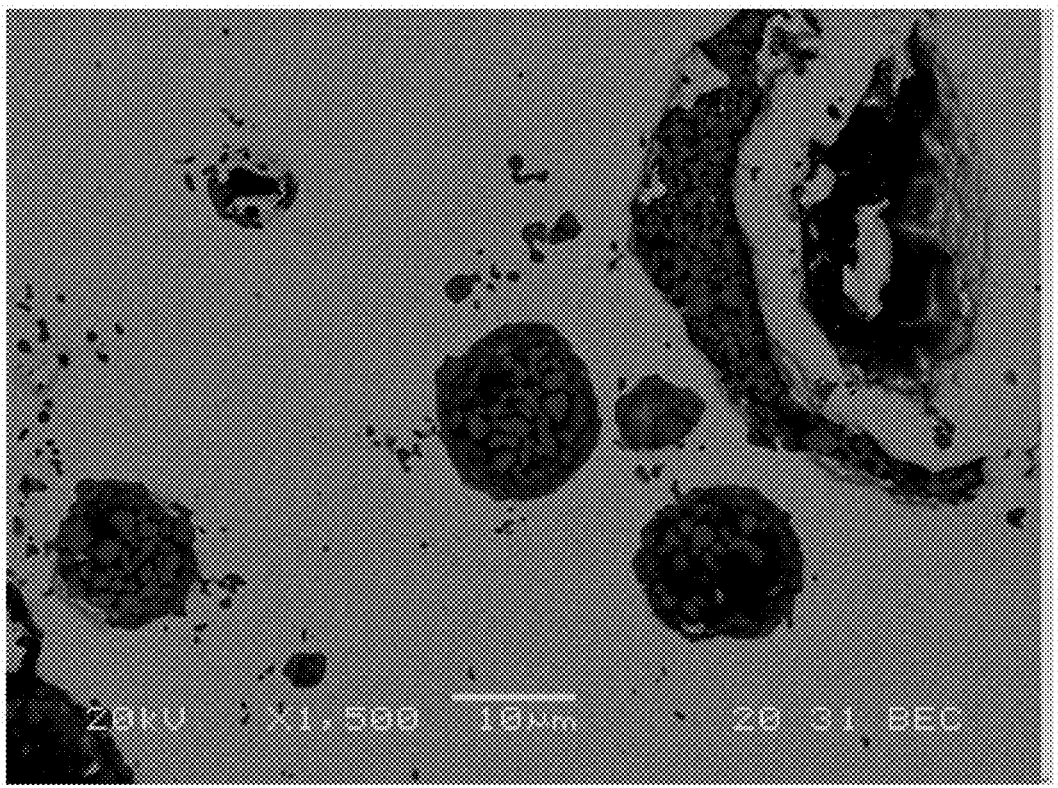

[FIG. 13]
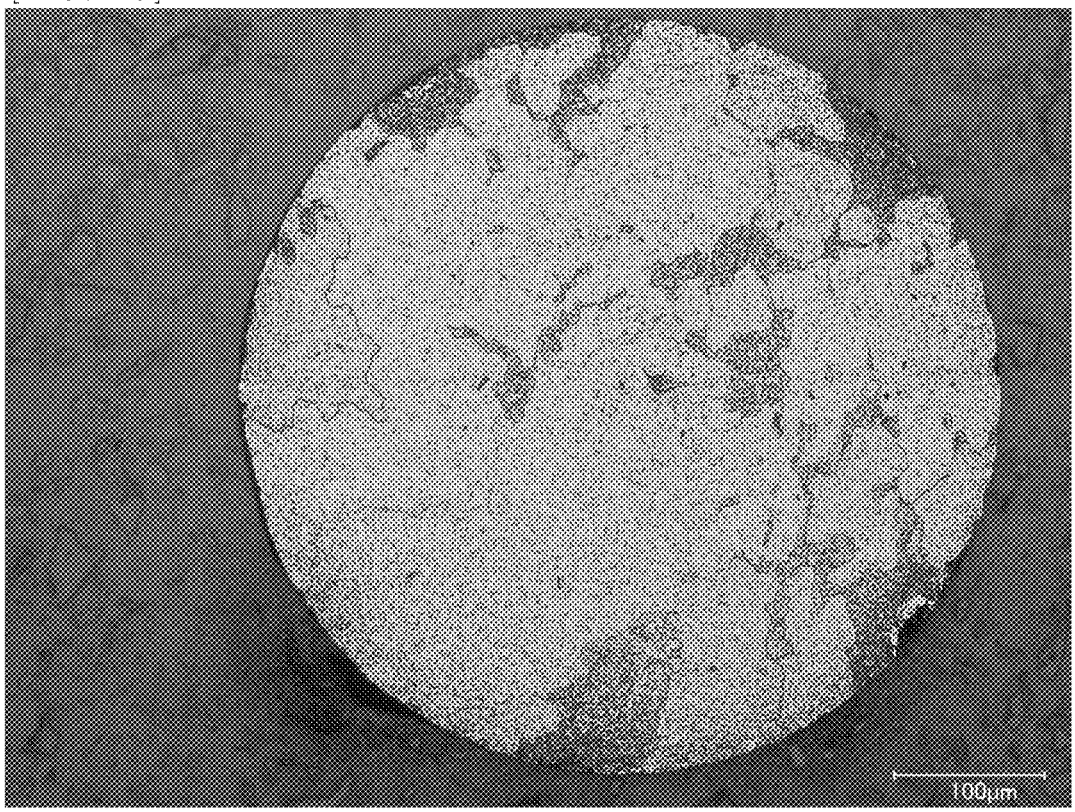

[FIG. 14]
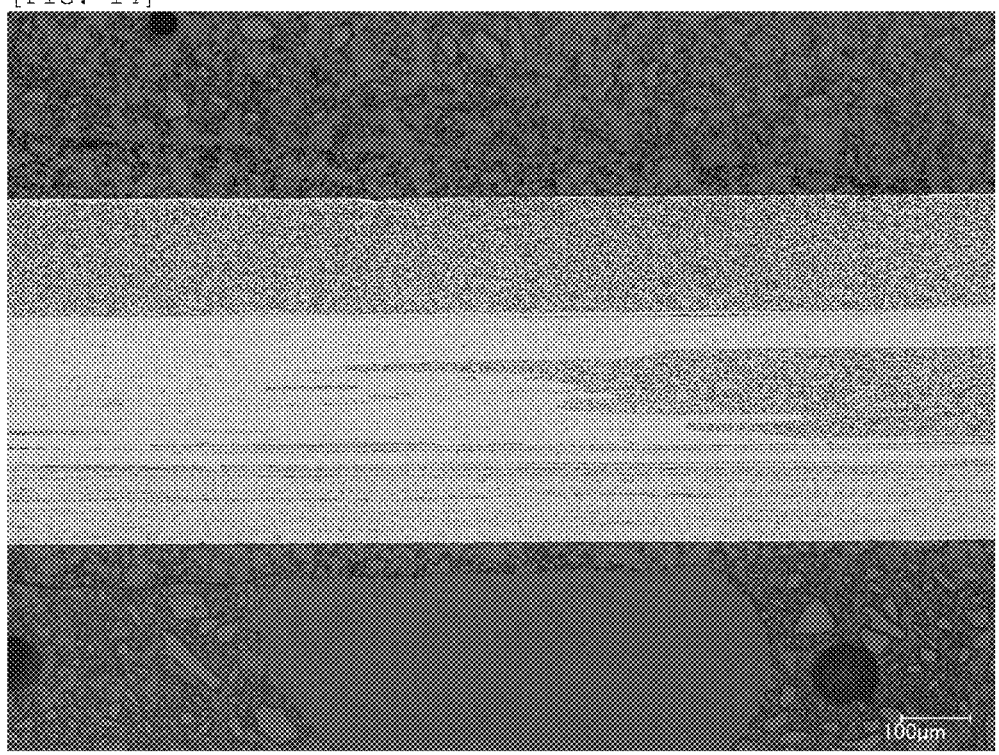

[FIG. 15]
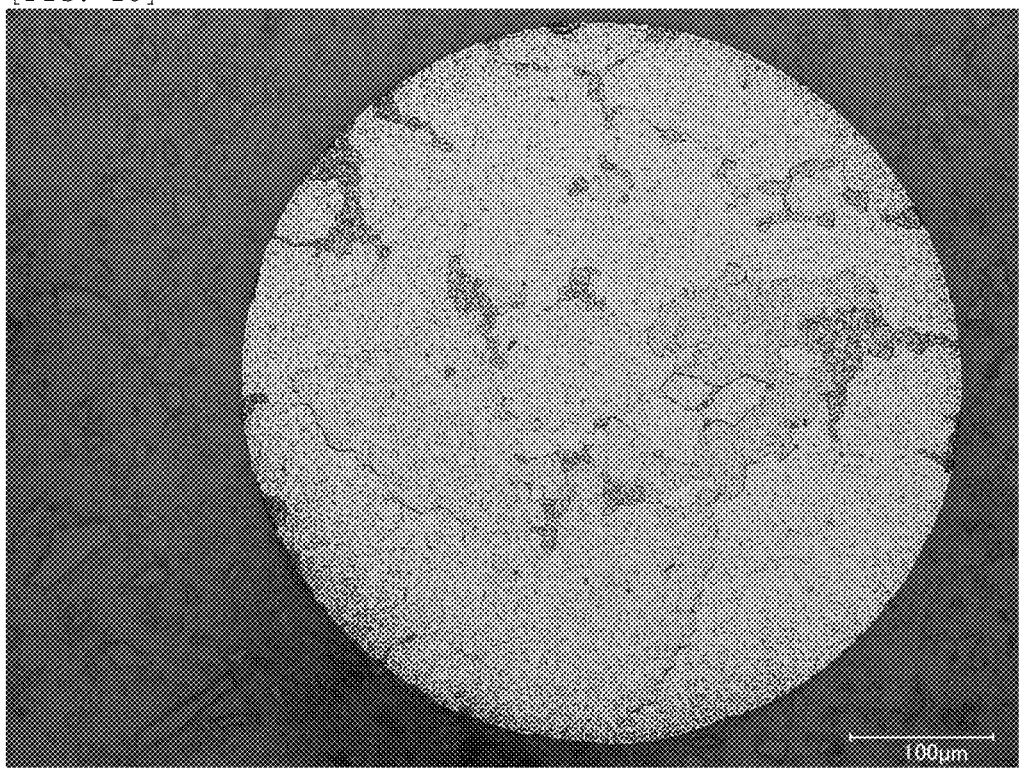

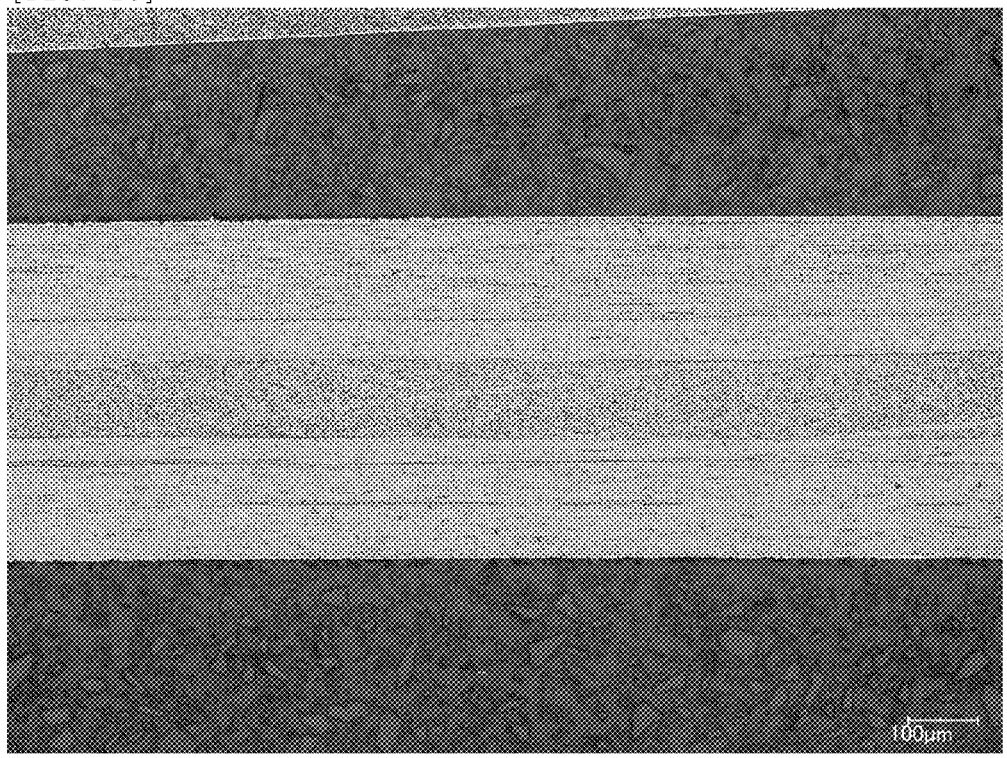
[FIG. 16]

[FIG. 17]
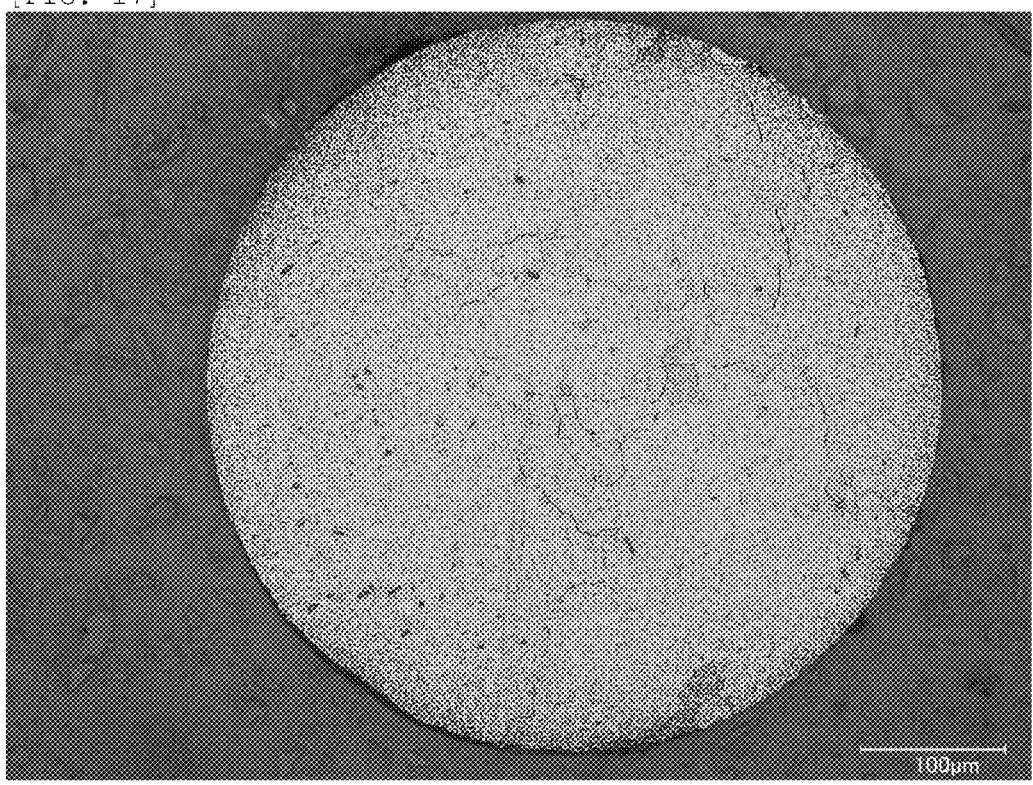

[FIG. 18]

[FIG. 19]
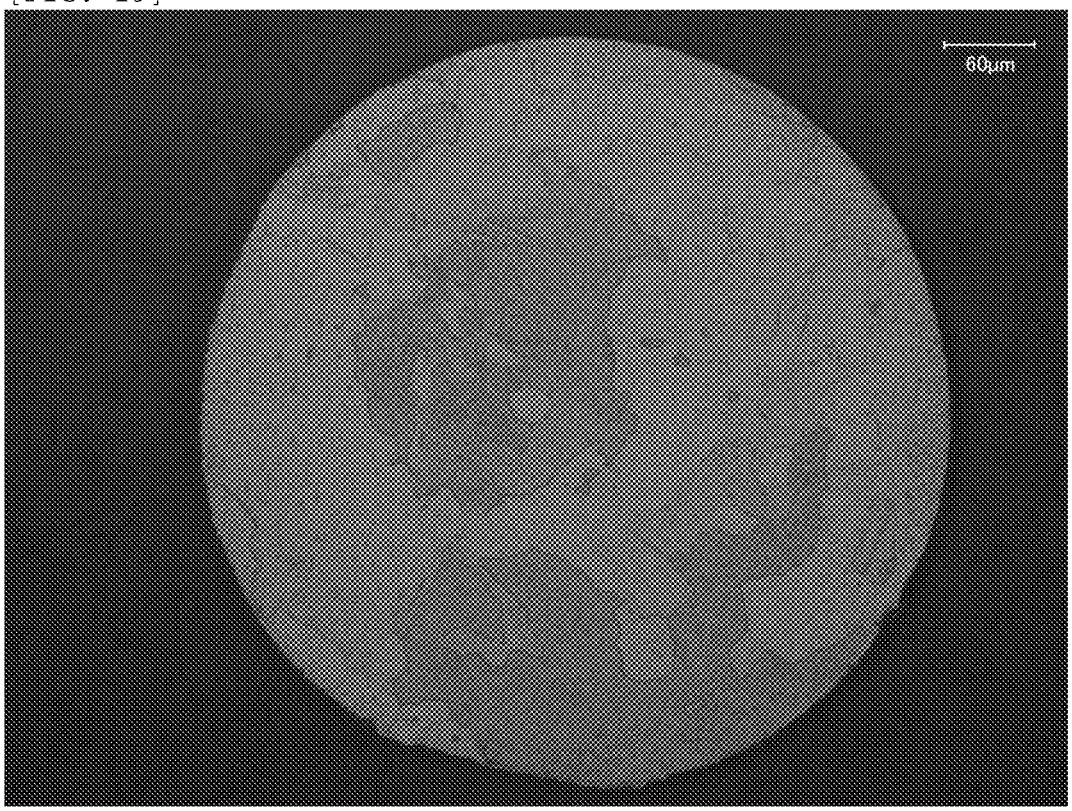

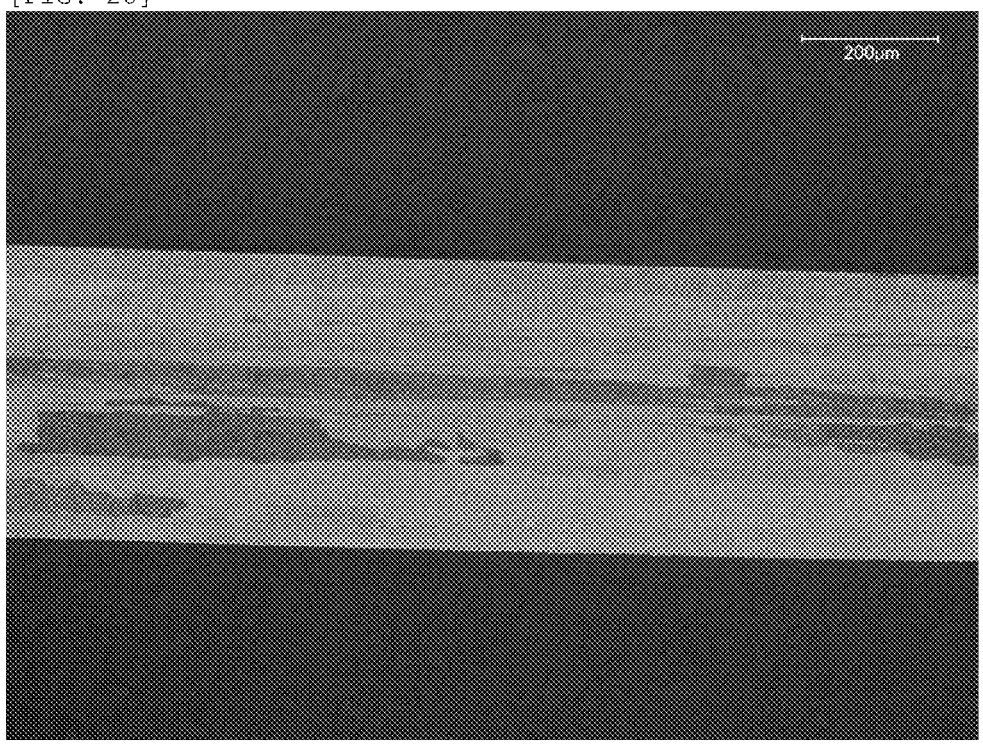
[FIG. 20]

[FIG. 21]
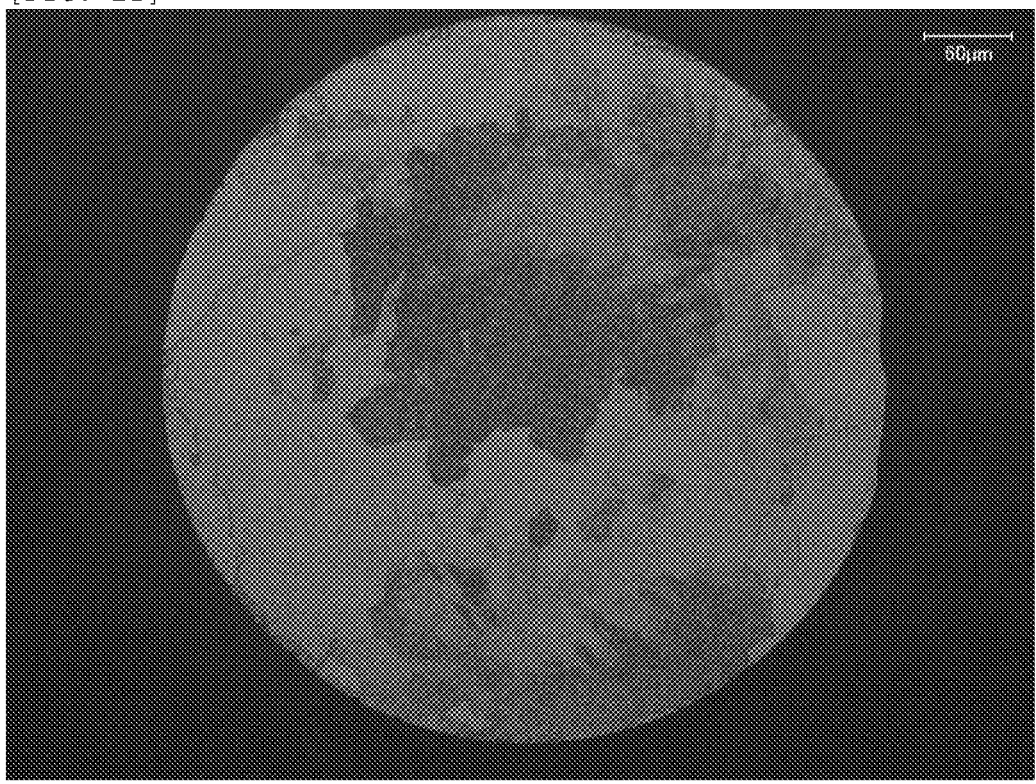

[FIG. 22]
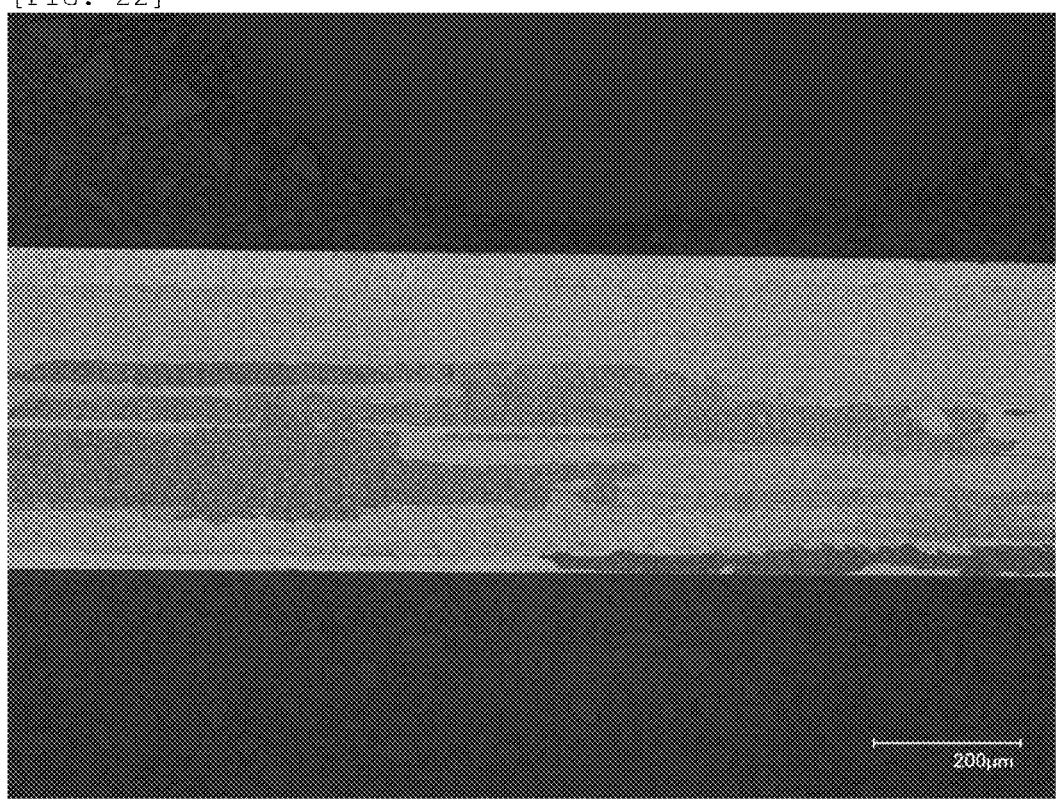

[FIG. 23]

[FIG. 24]
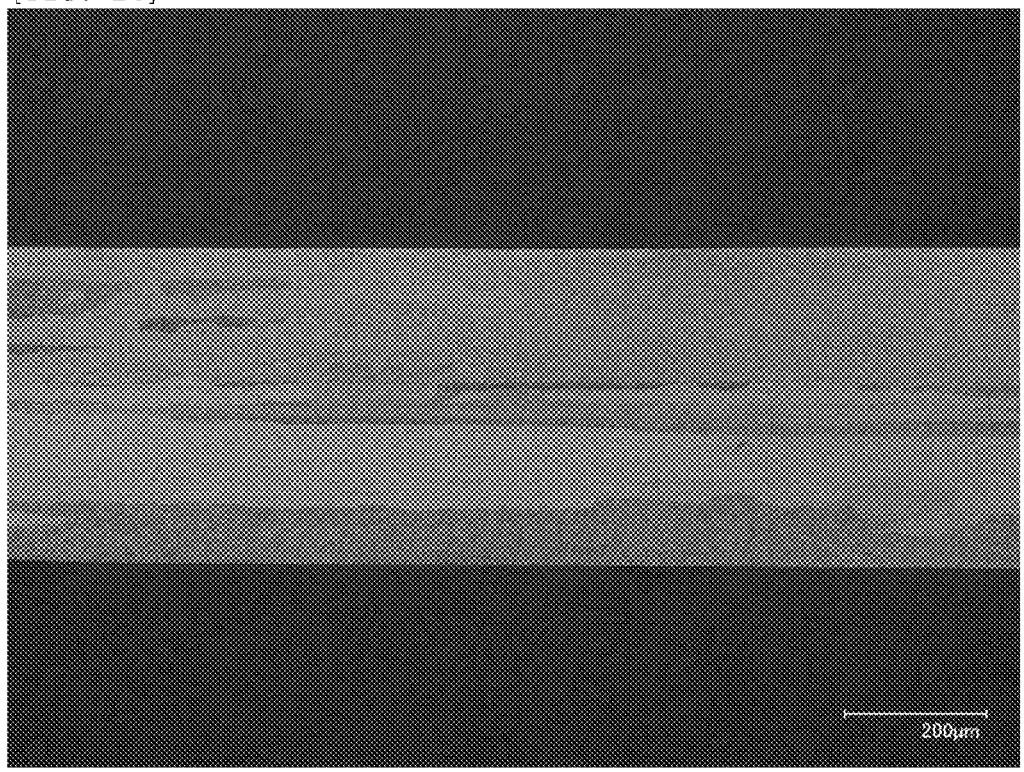

[FIG. 25]
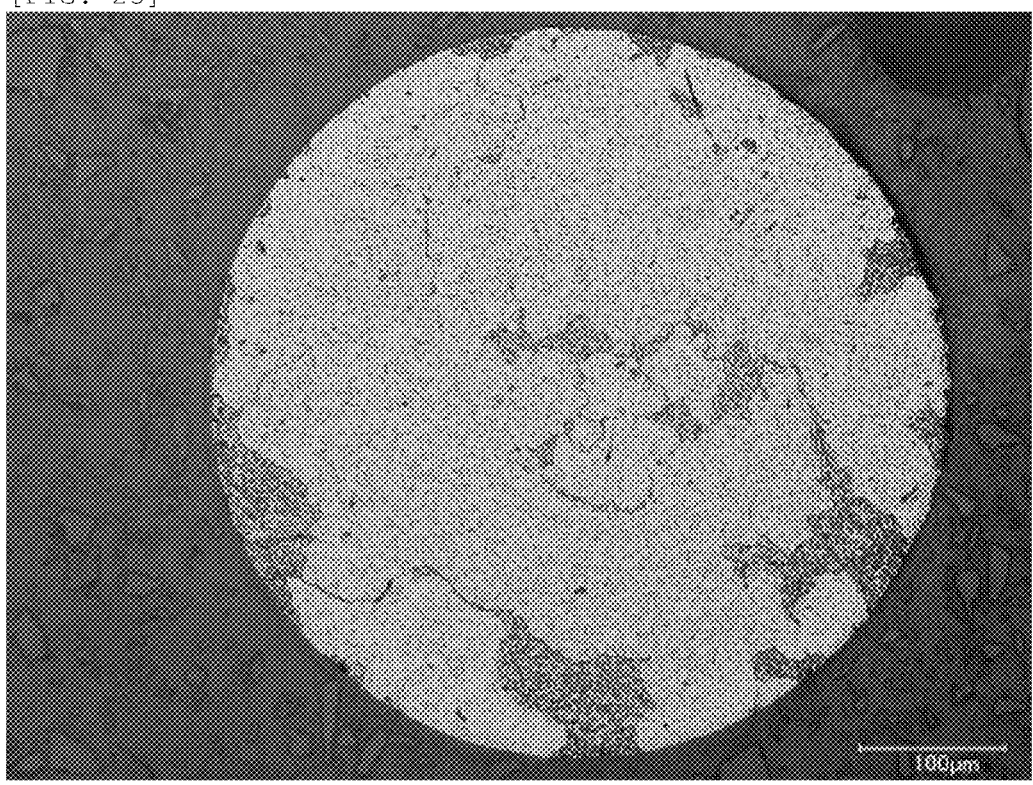

[FIG. 26]
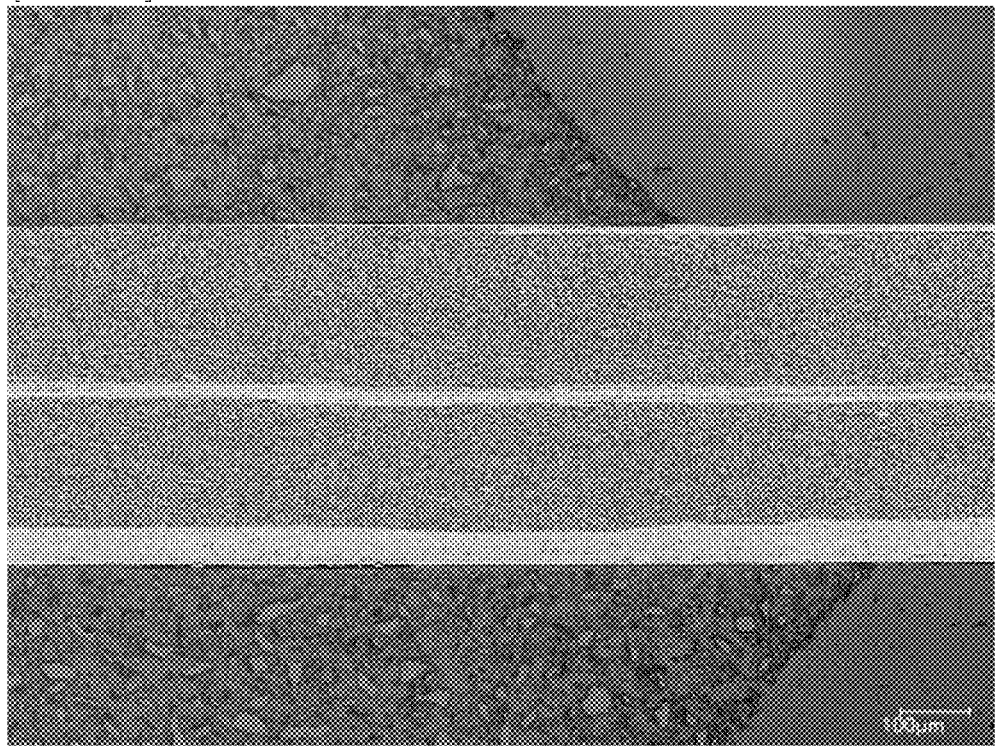

[FIG. 27]
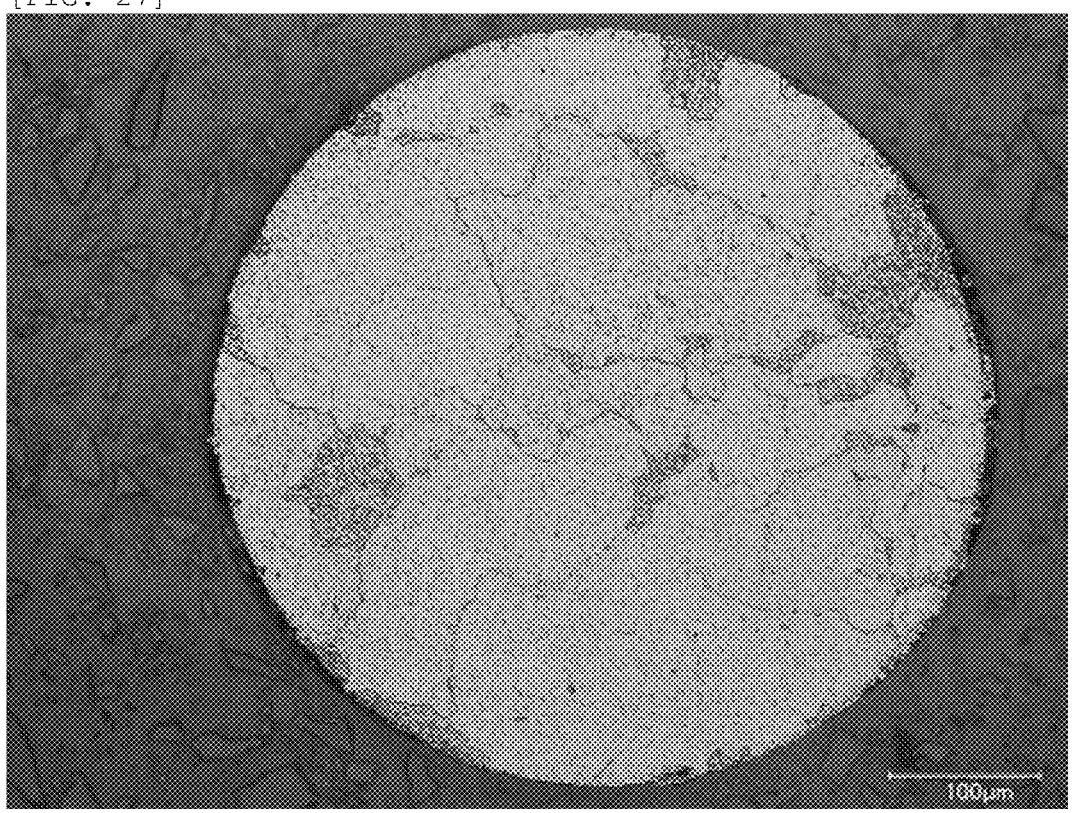

[FIG. 28]

[FIG. 29]
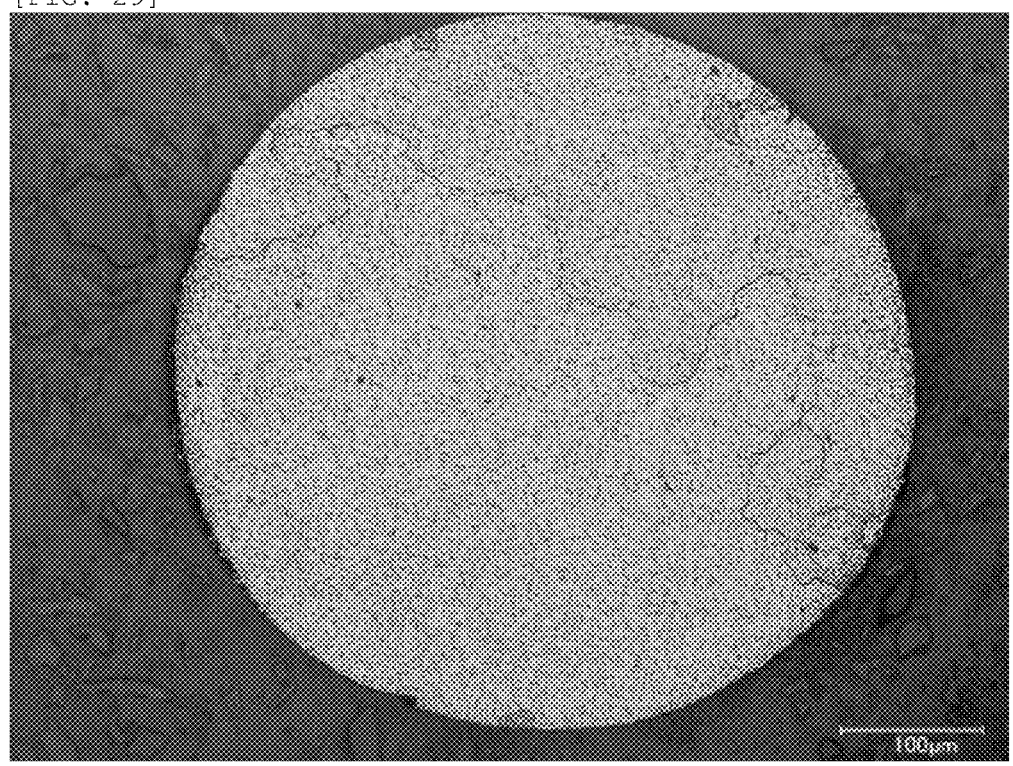

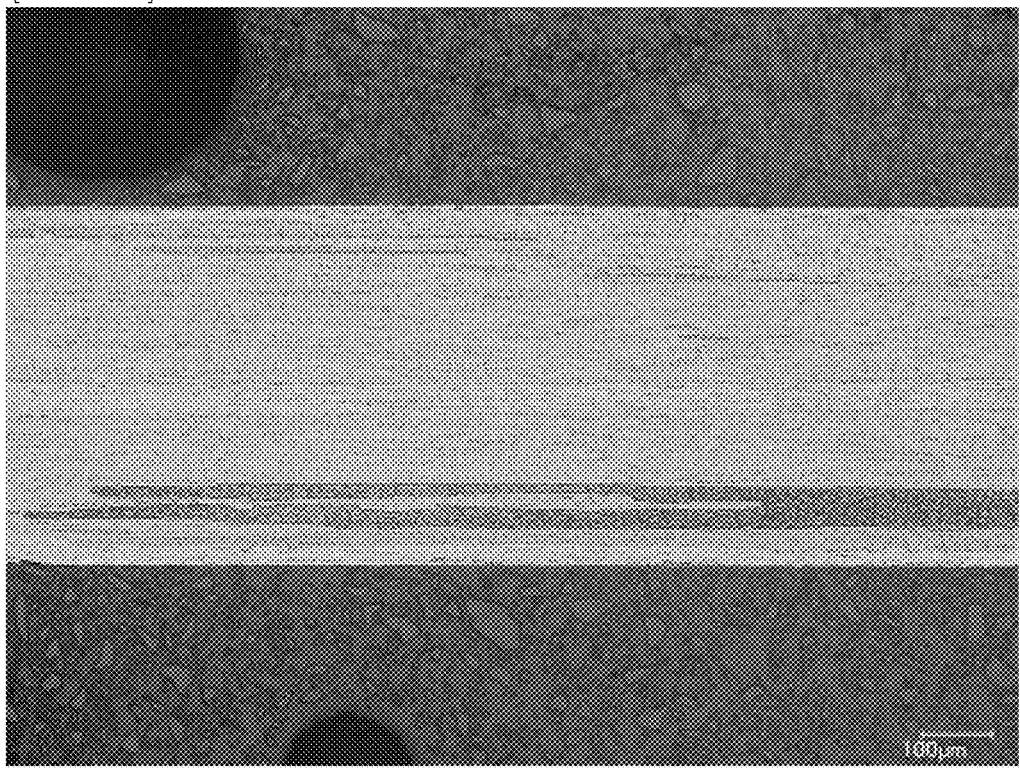
[FIG. 30]

PLATINUM THERMOCOUPLE WIRE

TECHNICAL FIELD

The present invention relates to a platinum thermocouple wire which is used in a negative electrode (negative pole) of a platinum-based thermocouple.

BACKGROUND ART

As a thermocouple using platinum, for example, an R thermocouple using a wire, which is formed from a platinum-rhodium alloy (rhodium 13%), as a positive electrode (positive pole) and a wire, which is formed from pure platinum, as a negative electrode and an S thermocouple using a wire, which is formed from a platinum-rhodium alloy (rhodium 10%), as a positive electrode and a wire, which is formed from pure platinum, as a negative electrode are mentioned.

When the wire formed from a platinum-rhodium alloy and the wire formed from pure platinum are compared with each other, since in the case of the pure platinum wire, creep strength is low and rupture occurs at an early stage, there is a problem in that the lifetime of the thermocouple is determined depending on rupture of the pure platinum wire.

In this regard, there is proposed a technique in which a Pt purity of a platinum wire is controlled to 5 N or more and zirconium oxide is dispersed in the wire so that occurrence of rupture is suppressed (for example, see Patent Literature 1).

PRIOR ART DOCUMENT

Patent Literature

Patent Literature 1: JP 2013-104705 A

SUMMARY OF INVENTION

Problems to be Solved by the Invention

In general, an increase in strength of metal can be achieved by the addition of another metal element, but when purity is decreased by the addition of the metal element, the thermocouple has a problem in that a deviation of thermal electromotive force occurs. In Patent Literature 1, in order to solve this problem, 0.02 to 0.5% by mass of Zr oxide is dispersed in the platinum wire so that a change in electromotive force is suppressed and an increase in strength is achieved.

However, although the addition of zirconium oxide enables the strength to increase, since an amount of the addition of oxide is large, in a thermocouple generally having a wire diameter of 700 $\mu m\phi$ or less, zirconium oxide is likely to be a starting point of breakage. In the thermocouple, generally, a wire having a wire diameter of 0.3 to 2 mm$\phi$ is used, and particularly, a wire having a wire diameter of 0.5 mm$\phi$ is used. Since the wire is very thin as described above, even in the case of a small load to be applied, this load becomes a large load per cross-sectional area, and thus creep rupture easily occurs. In addition, in the environment of use in a strong reducing atmosphere for a long time, zirconium oxide may be decomposed, and thus influence on electromotive force is inevitable.

Therefore, it is desirable that the strength of the wire can be increased without dispersing zirconium oxide, but only by using a single metal for a wire, a bamboo-like structure is easily formed by grain growth. When the bamboo-like structure is formed, crystal grain boundaries traverse in a radial direction of the wire, and thus slip easily occurs at the crystal grain boundaries. According to this, rupture occurs at an early stage.

An object of the present invention is to provide a platinum wire in which crystal growth is slowed in order to prevent damage caused by creep without dispersing a metal oxide, and occurrence of slip at crystal grain boundaries is slowed.

Means to Solution a Problem

The present inventors found that the above-described problem can be solved by containing a predetermined amount of a nitrogen element in a platinum wire, and thus have completed the present invention. A platinum thermocouple wire according to the present invention is a platinum thermocouple wire being used in a negative electrode of a platinum-based thermocouple, wherein a nitrogen mass concentration is 10 to 100 ppm, and when structure observation of the cross section of the wire passing in a longitudinal direction is performed, a structure is observed in which there is a plurality of crystal grains, which have an aspect ratio {(length of major axis)/(length of minor axis perpendicular to major axis)} of 5 or more and elongate in the longitudinal direction of the wire, in a wire thickness direction.

In the platinum thermocouple wire according to the present invention, a configuration is included in which, when the structure of the cross section of the wire in the longitudinal direction is observed after heat treatment at 1400° C. for 1 hour, a structure is observed in which there is a plurality of crystal grains, which have an aspect ratio {(length of major axis)/(length of minor axis perpendicular to major axis)} of 5 or more and elongate in the longitudinal direction of the wire, in the wire thickness direction.

In the platinum thermocouple wire according to the present invention, it is preferable that the total mass concentration of Cd, Sn, Zn, As, Sb, Pb, Bi, Se, Mo, C, S, P, Fe, Ru, Cr, Si, Ir, Ni, Rh, Cu, Pd, Ag, and Au is 50 ppm or less. Even when a trace amount of Cd, Sn, Zn, As, Sb, Pb, Bi, Se, Mo, C, Si, S, and P is contained, a low-melting-point compound is generated as well as an influence on electromotive force, which leads to damage of the thermocouple. In addition, since Fe, Ru, Pb, Cr, Si, Ir, Ni, Rh, Zn, Cu, Pd, Ag, and Au greatly influence the electromotive force, a small contamination thereof becomes problematic.

Effects of the Invention

The platinum thermocouple wire of the present invention slows crystal grain growth without dispersing a metal oxide and slows occurrence of slip at crystal grain boundaries. Therefore, damage caused by creep is prevented.

BRIEF DESCRIPTION OF DRAWINGS

FIG. 1 is an image of a cross section perpendicular to a longitudinal direction (wire drawing direction) of a platinum wire of Example 1 in EBSD observation.

FIG. 2 is an image of a cross section passing in the longitudinal direction of the platinum wire of Example 1 in EBSD observation.

FIG. 3 is an image of a cross section perpendicular to the longitudinal direction of the platinum wire of Example 1, which is further subjected to heat treatment, in EBSD observation.

FIG. 4 is an image of a cross section passing in the longitudinal direction of the platinum wire of Example 1, which is further subjected to heat treatment, in EBSD observation.

FIG. 5 is an image of a cross section perpendicular to the longitudinal direction of the platinum wire illustrated in FIG. 3 and FIG. 4, which is further subjected to heat treatment, in EBSD observation.

FIG. 6 is an image of a cross section passing in the longitudinal direction of the platinum wire illustrated in FIG. 3 and FIG. 4, which is further subjected to heat treatment, in EBSD observation.

FIG. 7 shows the check result of accuracy of a thermocouple of Example 1.

FIG. 8 is an image of a cross section perpendicular to the longitudinal direction of a platinum wire of Comparative Example 1 in optical microscope observation.

FIG. 9 is an image of a cross section passing in the longitudinal direction of the platinum wire of Comparative Example 1 in optical microscope observation.

FIG. 10 is an image of a cross section perpendicular to the longitudinal direction of the platinum wire of Comparative Example 1, which is further subjected to heat treatment, in optical microscope observation.

FIG. 11 is an image of a cross section passing in the longitudinal direction of the platinum wire of Comparative Example 1, which is further subjected to heat treatment, in optical microscope observation.

FIG. 12 is a reflected electron image of a spot welded portion of Comparative Example 2.

FIG. 13 is an image of a cross section perpendicular to the longitudinal direction of a platinum wire of Example 2 in optical microscope observation.

FIG. 14 is an image of a cross section passing in the longitudinal direction of the platinum wire of Example 2 in optical microscope observation.

FIG. 15 is an image of a cross section perpendicular to the longitudinal direction of the platinum wire of Example 2, which is further subjected to heat treatment, in optical microscope observation.

FIG. 16 is an image of a cross section passing in the longitudinal direction of the platinum wire of Example 2, which is further subjected to heat treatment, in optical microscope observation.

FIG. 17 is an image of a cross section perpendicular to the longitudinal direction of the platinum wire illustrated in FIG. 15 and FIG. 16, which is further subjected to heat treatment, in optical microscope observation.

FIG. 18 is an image of a cross section passing in the longitudinal direction of the platinum wire illustrated in FIG. 15 and FIG. 16, which is further subjected to heat treatment, in optical microscope observation.

FIG. 19 is an image of a cross section perpendicular to the longitudinal direction of a platinum wire of Example 3 in optical microscope observation.

FIG. 20 is an image of a cross section passing in the longitudinal direction of the platinum wire of Example 3 in optical microscope observation.

FIG. 21 is an image of a cross section perpendicular to the longitudinal direction of the platinum wire of Example 3, which is further subjected to heat treatment, in optical microscope observation.

FIG. 22 is an image of a cross section passing in the longitudinal direction of the platinum wire of Example 3, which is further subjected to heat treatment, in optical microscope observation.

FIG. 23 is an image of a cross section perpendicular to the longitudinal direction of the platinum wire illustrated in FIG. 21 and FIG. 22, which is further subjected to heat treatment, in optical microscope observation.

FIG. 24 is an image of a cross section passing in the longitudinal direction of the platinum wire illustrated in FIG. 21 and FIG. 22, which is further subjected to heat treatment, in optical microscope observation.

FIG. 25 is an image of a cross section perpendicular to the longitudinal direction of a platinum wire of Example 4 in optical microscope observation.

FIG. 26 is an image of a cross section passing in the longitudinal direction of the platinum wire of Example 4 in optical microscope observation.

FIG. 27 is an image of a cross section perpendicular to the longitudinal direction of the platinum wire of Example 4, which is further subjected to heat treatment, in optical microscope observation.

FIG. 28 is an image of a cross section passing in the longitudinal direction of the platinum wire of Example 4, which is further subjected to heat treatment, in optical microscope observation.

FIG. 29 is an image of a cross section perpendicular to the longitudinal direction of the platinum wire illustrated in FIG. 27 and FIG. 28, which is further subjected to heat treatment, in optical microscope observation.

FIG. 30 is an image of a cross section passing in the longitudinal direction of the platinum wire illustrated in FIG. 27 and FIG. 28, which is further subjected to heat treatment, in optical microscope observation.

MODE FOR CARRYING OUT THE INVENTION

Next, the present invention will be described in detail by way of embodiments; however, the present invention is not intended to be limited to these descriptions. Various modifications of the embodiments may be made as long as the effects of the present invention are exhibited.

A platinum thermocouple wire according to this embodiment is used in a negative electrode of a platinum-based thermocouple, in which a nitrogen mass concentration is 10 to 100 ppm, and when structure observation of the cross section of the wire passing in a longitudinal direction is performed, a structure is observed in which there is a plurality of crystal grains, which have an aspect ratio {(length of major axis)/(length of minor axis perpendicular to major axis)} of 5 or more and elongate in the longitudinal direction of the wire, in a wire thickness direction.

Since the platinum thermocouple wire is a wire used in a negative electrode, the purity of platinum is preferably 4 N or more. Examples of impurities with respect to platinum include Cd, Sn, Zn, As, Sb, Pb, Bi, Se, Mo, C, S, P, Fe, Ru, Cr, Si, Ir, Ni, Rh, Cu, Pd, Ag, and Au. The total mass concentration of these impurity elements is preferably 50 ppm or less and preferably 35 ppm or less. Even when a trace amount of Cd, Sn, Zn, As, Sb, Pb, Bi, Se, Mo, C, Si, S, and P is contained, a low-melting-point compound is generated as well as an influence on electromotive force, which leads to damage of the thermocouple. In addition, since Fe, Ru, Pb, Cr, Si, Ir, Ni, Rh, Zn, Cu, Pd, Ag, and Au greatly influence the electromotive force, a small contamination thereof becomes problematic. When the total mass concentration of these impurity elements is controlled to 50 ppm or less, it is possible to suppress generation of a low-melting-point compound and reduce the adverse effect on the electromotive force. The generation of a low-melting-point compound causes damage. Further, since this embodiment is not strengthened platinum in which metal oxide fine particles of zirconium, calcium, yttrium, samarium, or the like oxide are dispersed in the platinum thermocouple wire, there is no case where the metal oxide fine particles are decomposed to influence the electromotive force even when the platinum thermocouple wire is exposed under the environment in which the wire is used in a strong reducing atmosphere for a long time.

Meanwhile, a nitrogen element is intentionally introduced in the platinum thermocouple wire. The nitrogen mass concentration that is the mass concentration of the nitrogen element is 10 to 100 ppm, more preferably 15 to 80 ppm, and still more preferably 20 to 50 ppm. The nitrogen element is less likely to influence the electromotive force of the thermocouple and enables the growth of crystal grains at the time of using the thermocouple to be suppressed. When the nitrogen element is contained in more than 100 ppm, voids are formed, and thus these voids cause the deterioration in strength of the material. On the other hand, the growth of the crystal grains cannot be suppressed only by containing the nitrogen element in less than 10 ppm.

In the platinum thermocouple wire according to this embodiment, the presence state of the nitrogen element in platinum having a purity of 4 N or more is not clear; however, since platinum is difficult to form a nitride, it is speculated that the nitrogen element is in a state of a nitrogen molecule or a nitrogen atom with an unstable covalent bond.

In the platinum thermocouple wire according to this embodiment, an oxygen element may be contained in platinum. The presence state of the oxygen element in platinum is not clear; however, it is speculated that the oxygen element is in a state of an oxygen molecule or an oxygen atom with an unstable covalent bond. The oxygen mass concentration that is the mass concentration of the oxygen element is, for example, 10 to 50 ppm. Since the oxygen element in platinum having a purity of 4 N or more does not influence the electromotive force of the thermocouple and does not generate a low-melting-point compound, the oxygen element is not an impurity. However, unlike the nitrogen element, the oxygen element in platinum having a purity of 4 N or more does not exhibit the effect of suppressing the growth of crystal grains at the time of using the thermocouple and slowing occurrence of slip at crystal grain boundaries.

The wire diameter of the platinum thermocouple wire is usually 0.3 to 2.0 mmϕ; however, the wire diameter of the platinum thermocouple wire according to this embodiment is preferably 0.1 to 2.0 mmϕ and more preferably 0.3 to 1.0 mmϕ. In particular, even if the wire diameter is 700 μmϕ or less, since metal oxide fine particles of zirconia or the like are not dispersed in the wire, breakage originated at the metal oxide fine particles does not occur in the platinum thermocouple wire according to this embodiment.

In the platinum thermocouple wire according to this embodiment, it was possible to suppress the crystal grain growth by growing crystal grains, which have a larger aspect ratio and are coarse, after wire drawing process, even when the wire is exposed to high temperature at subsequent steps, and to achieve the creep strength at high temperature. When the structure observation of a cross section of the wire, which is completed through crystal grain growth, passing in the longitudinal direction of the wire is performed, a structure is observed in which there is a plurality of crystal grains, which have an aspect ratio {(length of major axis)/(length of minor axis perpendicular to major axis)} of 5 or more and elongate in the longitudinal direction of the wire, in a wire thickness direction. The aspect ratio is more preferably 5 or more but 40 or less and still more preferably 5 or more but 20 or less. When the aspect ratio is less than 5, there is a problem in that slip at grain boundaries cannot be effectively suppressed. Incidentally, in the case of a structure in which only one crystal grain having an aspect ratio of 5 or more is present in the wire thickness direction, since the wire is formed by a single crystal or a crystal particle close to a single crystal, there are problems in that slip easily occurs in the grains depending on the crystal orientation and rupture easily occurs.

Further, when the wire has a fine structure in which there is a plurality of crystal grains, which have an aspect ratio of 5 or more, in the wire thickness direction, the crystal grain growth at the subsequent steps is suppressed. Specifically, even if the completed wire is further subjected to heat treatment at 1400° C. for 1 hour, when the same structure observation of the cross section passing in the longitudinal direction of the wire is carried out, a structure is observed in which there is a plurality of crystal grains, which have an aspect ratio {(length of major axis)/(length of minor axis perpendicular to major axis)} of 5 or more and elongate in the longitudinal direction of the wire, in the wire thickness direction. That is, a wire formed from a bamboo-like structure is not formed.

Since the platinum thermocouple wire according to this embodiment has a nitrogen mass concentration of 10 to 100 ppm (1) and has a structure in which there is a plurality of crystal grains, which have an aspect ratio {(length of major axis)/(length of minor axis perpendicular to major axis)} of 5 or more and elongate in the longitudinal direction of the wire, in a wire thickness direction (2), the crystal grain growth is suppressed. As the method for suppressing the crystal grain growth, there is a strengthening method using metal oxide dispersion or a method of solution hardening by adding a metal element. The former method is less likely to influence a thermal electromotive force (hereinafter, also referred to as "e.m.f.") as long as a completely stable oxide is used; however, in a thermocouple which is used at high temperature and uses platinum, there is possibility that the stable oxide in platinum is reduced depending on atmosphere at which the thermocouple is used, although the reduced amount is trace, and thus a problem arises in reproducibility or stability of e.m.f. In addition, the latter method is a method of adding an element that becomes an impurity, and this method influences e.m.f. In the platinum thermocouple wire according to this embodiment, since the nitrogen mass concentration is 10 to 100 ppm (1), there is no influence on the electromotive force, and when a plurality of crystal grains, which have an aspect ratio of 5 or more, is present in the wire thickness direction (2), the growth of the crystal grains at high temperature can be suppressed.

Next, the method for producing the platinum thermocouple wire according to this embodiment will be described. First, refined Pt powder is prepared. The Pt powder is, for example, preferably powder, which is chemically refined through a wet process, and is porous. The BET specific surface area of the powder is preferably 0.01 to 50 m$^2$/g and more preferably 0.1 to 30 m$^2$/g. This porous powder is put into a vacuum chamber, the vacuum chamber is evacuated to 10 Pa or less, and then nitrogen gas is put into the vacuum chamber, thereby adsorbing the nitrogen gas to the surface of the powder. Then, this powder is subjected to powder sintering to obtain a sintered body. As a sintering method, hot isostatic pressing method (HIP), cold isostatic pressing method (CIP), hot pressing method (HP), spark plasma sintering method (SPS), or the like is employed. In order to suppress the growth of the crystal grain, a method capable of performing sintering in a short time is preferable. HP is preferably used, and SPS is more preferably used. Next, the obtained sintered body is subjected to hot forging in a rod shape, and the rod-shaped hot forged product is subjected to wire drawing process through grooved rolling, swaging, or wire drawing to obtain a platinum wire having a wire diameter of 0.1 to 2.0 mmϕ, for example, a wire diameter of 0.5 mmϕ. Thereafter, the platinum wire is subjected to heat treatment at 800 to 1700° C., preferably 900 to 1600° C., for 0.01 to 2 hours, preferably 1 to 60 minutes to form a structure in which there is a plurality of crystal grains, which have an aspect ratio of 5 or more, in the wire thickness direction.

The Pt powder may adsorb the nitrogen element in advance by using any one or more of ammonia ($NH_3$), an ammine complex having ammonia as a ligand, a compound having ammonium ions ($NH_4+$) (for example, ammonium chloride), hydrazine, and a hydrazine derivative, in the wet process. In this case, it is not necessary to perform the process of adsorbing the nitrogen gas again.

EXAMPLES

Hereinafter, the present invention will be described in more detail with reference to Examples; however, the present invention is not intended to be limited to Examples.

Example 1

1000 g of high-purity platinum powder (platinum purity: 4 N, BET specific surface area: 0.195 $m^2$/g, porous powder, manufactured by FURUYA METAL Co., Ltd.) was prepared, this platinum powder was put into a vacuum chamber, the vacuum chamber was evacuated to 10 Pa or less, and then nitrogen gas (nitrogen gas purity: 4 N) was put into the vacuum chamber, thereby adsorbing the nitrogen gas to the surface of the platinum powder (including the surface in the pores). At this time, the nitrogen mass concentration as measured by a gas analyzer was 97 ppm. In addition, the oxygen mass concentration was 383 ppm. This platinum powder was sintered in vacuum by using a spark plasma sintering method to produce a platinum ingot (40 mmϕ×40 mmh). The surface of this ingot was cleaned through machining or chemical treatment using aqua regia to remove the impurities. The nitrogen mass concentration of this platinum ingot was 80 ppm. In addition, the oxygen mass concentration was 87 ppm. Thereafter, the platinum ingot was subjected to hot forging in air, and similarly, the surface of the platinum ingot was cleaned through machining or chemical treatment using aqua regia. The nitrogen mass concentration of this platinum ingot was 17 ppm. In addition, the oxygen mass concentration was 39 ppm. Next, the platinum ingot was subjected to grooved rolling or swaging in air at room temperature. At this time, the nitrogen mass concentration was 26 ppm. In addition, the oxygen mass concentration was 36 ppm. Then, a wire material having a wire diameter of 0.5 mmϕ was prepared by using a wire-drawing machine. At this time, the nitrogen mass concentration of the wire material was 26 ppm. In addition, the oxygen mass concentration was 29 ppm. Next, in order to remove distortion stress at the time of processing, this wire material was subjected to heat treatment at 1000° C. for 1 hour in an air atmosphere to obtain a platinum wire of Example 1. The nitrogen mass concentration of this platinum wire was 26 ppm. Incidentally, the oxygen mass concentration was 29 ppm. Further, when the contamination of impurity elements in the platinum wire obtained in Example 1 was analyzed by using a GD-MASS analyzer (ELEMENT GD manufactured by Thermo Fisher Scientific Inc.), the contamination of impurity elements was as follows: Cd: 0.4 ppm, Zn: 0.1 ppm, C: 0.9 ppm, Fe: 7.8 ppm, Ru: 13.1 ppm, Cr: 1.8 ppm, Si: 6.9 ppm, Ir: 5.7 ppm, Ni: 0.2 ppm, Rh: 1.8 ppm, Cu: 0.3 ppm, Pd: 2.4 ppm, and Au: 0.7 ppm, the sum of these impurities was 42.1 ppm (mass concentration), and the total amount of impurities including other impurities was 43.6 ppm (mass concentration). Then, for determination of details of the structure size, a cross section and a crystal plane orientation in the longitudinal direction were exposed by using an electron backscatter diffraction (EBSD) method. FIG. 1 shows an image of a cross section in EBSD observation and FIG. 2 shows an image of the longitudinal direction in EBSD observation. In the cross section of FIG. 1, the crystal is approximated to an equiaxial crystal and the crystal becomes coarse. On the other hand, when the longitudinal direction of FIG. 2 is observed, it can be observed that the structure has an extremely large aspect ratio {(length of major axis)/(length of minor axis perpendicular to major axis)}, and the aspect ratio is 5 or more. The aspect ratio was specifically 6.3 as a minimum value. In addition, there was a plurality of crystal grains in the wire thickness direction.

The nitrogen mass concentration and the oxygen mass concentration were measured by a gas analyzer according to the following method. That is, using an oxygen/nitrogen simultaneous analyzer (TC-600 Type manufactured by LECO CORPORATION), nitrogen was measured by an inert gas fusion-thermal conductivity method and oxygen was measured by an inert gas fusion-infrared absorption method. For measurement, He was used as a carrier gas, a graphite crucible (product name: High-Temperature Crucible, Part No. 782-720) was used as a crucible, a Ni capsule was used as a flux, and the amount of a sample to be used for each measurement was set to 0.2 g. A sample other than powder was collected by machine processing or cutting with a nipper, and the sample was degreased with acetone before measurement. Regarding the nitrogen mass concentration and the oxygen mass concentration in each step, samples were collected from arbitrary three points and an average value of values obtained from three times of measurement was shown; however, the collection position of a sample and the number of samples to be collected are not limited.

The platinum wire obtained in Example 1 was further subjected to heat treatment at 1000° C. for 1 hour in an air atmosphere (referred to as "platinum wire 1-A"). At this time, the nitrogen mass concentration was 26 ppm. Incidentally, the oxygen mass concentration was 29 ppm. In addition, the structure observation was performed in the similar way. FIG. 3 shows an image of a cross section in EBSD observation and FIG. 4 shows an image of the longitudinal direction in EBSD observation. As comparing FIGS. 1 and 2 and FIGS. 3 and 4 with each other, it was found that there is no large change in crystals. The aspect ratio was specifically 5.1 as a minimum value.

The platinum wire obtained in Example 1 was further subjected to heat treatment at 1400° C. for 1 hour in an air atmosphere (referred to as "platinum wire 1-B"). At this time, the nitrogen mass concentration was 26 ppm. Incidentally, the oxygen mass concentration was 29 ppm. In addition, the structure observation was performed in the similar way. FIG. 5 shows an image of a cross section in EBSD observation and FIG. 6 shows an image of the longitudinal direction in EBSD observation. As comparing FIGS. 1 and 2, FIGS. 3 and 4, and FIGS. 5 and 6 with one another, it was found that there is no large change in crystals. The slight growth of crystal grains in the wire thickness direction was observed from the longitudinal direction. The aspect ratio was specifically 5.0 as a minimum value.

As comparing the platinum wire, the platinum wire 1-A, and the platinum wire 1-B of Example 1 with one another, the following facts are found. That is, in the case of a polycrystal of general metal, as the heat treatment temperature increases and the heat treatment time increases, there is a tendency that the crystal grains are grown and become large. As comparing three wires with one another, it was found that they are deviated from this tendency, the sizes of the crystal grains are almost the same, and the growth of the crystal grains is suppressed even when the heat treatment is carried out.

Next, the creep rupture time of the platinum wire of Example 1 was measured. The condition was set as follows: 1000° C., 15 MPa, and an air atmosphere. Under this condition, the wire was not broken even if the time exceeded 650 hours. Further, the creep rupture time of the platinum wire of Example 1 was measured under the condition including 1400° C., 15 MPa, and an air atmosphere. As a result, the wire was broken at 41 minutes. It was found that the platinum wire of Example 1 has sufficient strength even at 1400° C.

Furthermore, the creep rupture time of the platinum wire of Example 1 was measured under the condition including 1100° C., 15 MPa, an air atmosphere. Under this condition, the wire was broken at 229 hours. It was found that the platinum wire of Example 1 has sufficient strength even at 1100° C.

A comparison calibration test was carried out using the platinum wire of Example 1 to check the accuracy of the thermocouple. After the platinum wire of Example 1 was exposed at 1400° C. for 100 hours (referred to as "platinum wire 1-C"), the same comparison calibration was carried out to check drift. Incidentally, a wire that was paired with the platinum wire was set to Pt-13Rh 0.5 mmφ. The results thereof are presented in FIG. 7. As seen in FIG. 7, it was confirmed that the thermocouple is a high-accuracy thermocouple which sufficiently satisfies the accuracy of Class 1 defined in JIS C 1602:1995 and also has no problem in terms of drift. In FIG. 7, 0 Hr indicates data of the platinum wire of Example 1 and 100 Hr indicates data of the platinum wire 1-C.

Comparative Example 1

5000 g of high-purity platinum powder (platinum purity: 4 N) was prepared, this platinum powder was melted through vacuum melting to produce a platinum ingot (90× 28×68 mm). The surface of this ingot was cleaned through machining or chemical treatment using aqua regia to remove the impurities. The nitrogen mass concentration of the platinum ingot at this time as measured by a gas analyzer was equal to or less than a detection limit. Thereafter, the platinum ingot was subjected to hot forging in air, and similarly, the surface of the platinum ingot was cleaned through machining or chemical treatment using aqua regia. The nitrogen mass concentration of this platinum ingot was equal to or less than the detection limit. Next, the platinum ingot was subjected to grooved rolling or swaging in air at room temperature. At this time, the nitrogen mass concentration was equal to or less than the detection limit. Then, a wire material having a wire diameter of 0.5 mmφ was prepared by using a wire-drawing machine. At this time, the nitrogen mass concentration of the wire material was equal to or less than the detection limit. Next, in order to remove distortion stress at the time of processing, this wire material was subjected to heat treatment at 1000° C. for 1 hour in an air atmosphere to obtain a platinum wire of Comparative Example 1. The nitrogen mass concentration of this platinum wire was equal to or less than the detection limit (the detection limit is less than 9 ppm). Further, when the contamination of impurity elements in the platinum wire obtained in Comparative Example 1 was analyzed by using a GD-MASS analyzer, the contamination of impurity elements was as follows: Zn: 0.1 ppm, Fe: 1.8 ppm, Ru: 0.6 ppm, Cr: 0.1 ppm, Si: 0.5 ppm, Ir: 2.4 ppm, Rh: 1.9 ppm, Pd: 1.1 ppm, and Au: 2.4 ppm, the sum of these impurities was 10.9 ppm (mass concentration), and the total amount of impurities including other impurities was 14.2 ppm (mass concentration). In addition, the structure observation was performed in the similar way. FIG. 8 shows an image of a cross section in optical microscope observation and FIG. 9 shows an image of the longitudinal direction in optical microscope observation. As seen in FIG. 8 and FIG. 9, the platinum wire of Comparative Example 1 had a small aspect ratio of the structure, and became a so-called equiaxial crystal. When the longitudinal direction of FIG. 9 was observed, the aspect ratio was specifically 3.6 as a maximum value.

The platinum wire obtained in Comparative Example 1 was further subjected to heat treatment at 1400° C. for 1 hour in an air atmosphere (referred to as "platinum wire 1-D"). At this time, the nitrogen mass concentration was equal to or less than the detection limit. In addition, the structure observation was performed in the similar way. FIG. 10 shows an image of a cross section in optical microscope observation and FIG. 11 shows an image of the longitudinal direction in optical microscope observation. As comparing FIGS. 8 and 9 and FIGS. 10 and 11 with each other, it was found that the crystal grains become extremely large and coarse and are grown as single crystals. Since the crystal grains were significantly coarse, the aspect ratio could not be measured.

As comparing the platinum wire and the platinum wire 1-D of Comparative Example 1 with each other, the following facts are found. That is, in the platinum wire of Comparative Example 1, unlike the case of Example 1, when the heat treatment was carried out, the growth of the crystal grains are not suppressed.

Next, the creep rupture time of the platinum wire of Comparative Example 1 was measured. The condition was set as follows: 1000° C., 15 MPa, and an air atmosphere. Under this condition, the wire was broken at 50 minutes (0.8 hours). In addition, the creep rupture time of the platinum wire of Comparative Example 1 was measured under the condition including 1400° C., 15 MPa, and an air atmosphere. As a result, the wire was broken at 3 minutes. It was found that the platinum wire of Comparative Example 1 does not have sufficient strength.

Comparative Example 2

A zirconia oxide-dispersion-strengthened platinum wire having a wire diameter of 0.5 mmφ was prepared. A wire that was paired with the platinum wire was set to Pt-13Rh 0.5 mmφ, and tip ends of these wires were spot-welded. FIG. 12 shows a reflected electron image of a spot welded portion of Comparative Example 2. It was found in the image that zirconia oxide is agglomerated in a round hole. That is, it was observed that zirconia oxide is agglomerated by spot welding. Such agglomeration becomes a starting point of breakage, and thus the welded portion is easily broken.

Example 2

1000 g of high-purity platinum powder (platinum purity: 4 N, BET specific surface area: 0.195 m$^2$/g, porous powder, manufactured by FURUYA METAL Co., Ltd.) was prepared, this platinum powder was put into a vacuum chamber, the vacuum chamber was evacuated to 10 Pa or less, and then nitrogen gas (nitrogen gas purity: 4 N) was put into the vacuum chamber, thereby adsorbing the nitrogen gas to the surface of the platinum powder (including the surface in the pores). At this time, the nitrogen mass concentration as measured by a gas analyzer was 103 ppm. In addition, the oxygen mass concentration was 389 ppm. This platinum powder was sintered in vacuum by using a spark plasma sintering method to produce a platinum ingot (40 mmϕ×40 mmh). The surface of this ingot was cleaned through machining or chemical treatment using aqua regia to remove the impurities. The nitrogen mass concentration of this platinum ingot was 84 ppm. In addition, the oxygen mass concentration was 73 ppm. Thereafter, the platinum ingot was subjected to hot forging in air, and similarly, the surface of the platinum ingot was cleaned through machining or chemical treatment using aqua regia. The nitrogen mass concentration of this platinum ingot was 32 ppm. In addition, the oxygen mass concentration was 47 ppm. Next, the platinum ingot was subjected to grooved rolling or swaging in air at room temperature. At this time, the nitrogen mass concentration was 47 ppm. In addition, the oxygen mass concentration was 48 ppm. Then, a wire material having a wire diameter of 0.5 mmϕ was prepared by using a wire-drawing machine. At this time, the nitrogen mass concentration of the wire material was 52 ppm. In addition, the oxygen mass concentration was 31 ppm. Next, in order to remove distortion stress at the time of processing, this wire material was subjected to heat treatment at 1000° C. for 1 hour in an air atmosphere to obtain a platinum wire of Example 2. The nitrogen mass concentration of this platinum wire was 52 ppm. Incidentally, the oxygen mass concentration was 31 ppm. Further, when the contamination of impurity elements in the platinum wire obtained in Example 2 was analyzed by using a GD-MASS analyzer, the contamination of impurity elements was as follows: Cd: 0.1 ppm, Zn: 0.1 ppm, C: 2.0 ppm, Fe: 4.2 ppm, Ru: 6.9 ppm, Cr: 0.8 ppm, Si: 4.6 ppm, Ir: 3.7 ppm, Ni: 0.1 ppm, Rh: 1.1 ppm, Cu: 0.1 ppm, Pd: 1.5 ppm, and Au: 0.3 ppm, the sum of these impurities was 25.5 ppm (mass concentration), and the total amount of impurities including other impurities was 26.8 ppm (mass concentration). Then, for determination of the structure size, the structure observation was performed. FIG. 13 shows an image of a cross section in optical microscope observation and FIG. 14 shows an image of the longitudinal direction in optical microscope observation. In the cross section of FIG. 13, the crystal is approximated to an equiaxial crystal and the crystal becomes coarse. On the other hand, when the longitudinal direction of FIG. 14 is observed, it can be observed that the structure has an extremely large aspect ratio {(length of major axis)/(length of minor axis perpendicular to major axis)}, and the aspect ratio is 5 or more. The aspect ratio was specifically 6.8 as a minimum value. In addition, there was a plurality of crystal grains in the wire thickness direction.

The platinum wire obtained in Example 2 was further subjected to heat treatment at 1000° C. for 1 hour in an air atmosphere (referred to as "platinum wire 2-A"). At this time, the nitrogen mass concentration was 51 ppm. Incidentally, the oxygen mass concentration was 31 ppm. In addition, the structure observation was performed in the similar way. FIG. 15 shows an image of a cross section in optical microscope observation and FIG. 16 shows an image of the longitudinal direction in optical microscope observation. As comparing FIGS. 13 and 14 and FIGS. 15 and 16 with each other, it was found that there is no large change in crystals. The aspect ratio was specifically 6.2 as a minimum value.

The platinum wire obtained in Example 2 was further subjected to heat treatment at 1400° C. for 1 hour in an air atmosphere (referred to as "platinum wire 2-B"). At this time, the nitrogen mass concentration was 50 ppm. Incidentally, the oxygen mass concentration was 30 ppm. In addition, the structure observation was performed in the similar way. FIG. 17 shows an image of a cross section in optical microscope observation and FIG. 18 shows an image of the longitudinal direction in optical microscope observation. As comparing FIGS. 13 and 14, FIGS. 15 and 16, and FIGS. 17 and 18 with one another, it was found that there is no large change in crystals. The slight growth of crystal grains in the wire thickness direction was observed from the longitudinal direction. The aspect ratio was specifically 5.7 as a minimum value.

As comparing the platinum wire, the platinum wire 2-A, and the platinum wire 2-B of Example 2 with one another, the following facts are found. That is, in the case of a polycrystal of general metal, as the heat treatment temperature increases and the heat treatment time increases, there is a tendency that the crystal grains are grown and become large. As comparing three wires with one another, it was found that they are deviated from this tendency, the sizes of the crystal grains are almost the same, and the growth of the crystal grains is suppressed even when the heat treatment is carried out.

Next, the creep rupture time of the platinum wire of Example 2 was measured. The condition was set as follows: 1100° C., 15 MPa, and an air atmosphere. Under this condition, the wire was not broken even if the time exceeded 410 hours. It was found that the platinum wire of Example 2 has sufficient strength.

A comparison calibration test was carried out using the platinum wire of Example 2 to check the accuracy of the thermocouple. A wire that was paired with the platinum wire was set to Pt-13Rh 0.5 mmϕ. As a result, it was confirmed that the thermocouple sufficiently satisfies the accuracy of Class 1 defined in JIS C 1602:1995.

Example 3

1000 g of high-purity platinum powder (platinum purity: 4 N, BET specific surface area: 0.195 m$^2$/g, porous powder, manufactured by FURUYA METAL Co., Ltd.) was prepared, this platinum powder was put into a vacuum chamber, the vacuum chamber was evacuated to 10 Pa or less, and then nitrogen gas (nitrogen gas purity: 4 N) was put into the vacuum chamber, thereby adsorbing the nitrogen gas to the surface of the platinum powder (including the surface in the pores). At this time, the nitrogen mass concentration as measured by a gas analyzer was 109 ppm. In addition, the oxygen mass concentration was 375 ppm. This platinum powder was sintered in vacuum by using a spark plasma sintering method to produce a platinum ingot (40 mmϕ×40 mmh). The surface of this ingot was cleaned through machining or chemical treatment using aqua regia to remove the impurities. The nitrogen mass concentration of this platinum ingot was 84 ppm. In addition, the oxygen mass concentration was 64 ppm. Thereafter, the platinum ingot was subjected to hot forging in air, and similarly, the surface of the platinum ingot was cleaned through machining or chemical treatment using aqua regia. The nitrogen mass concentration of this platinum ingot was 7 ppm. In addition, the oxygen mass concentration was 46 ppm. Next, the platinum ingot was subjected to grooved rolling or swaging in air at room temperature. At this time, the nitrogen mass concentration was 15 ppm. In addition, the oxygen mass concentration was 25 ppm. Then, a wire material having a wire diameter of 0.5 mmϕ was prepared by using a wire-drawing machine. At this time, the nitrogen mass concentration of the wire material was 15 ppm. In addition, the oxygen mass concentration was 22 ppm. Next, in order to remove distortion stress at the time of processing, this wire material was subjected to heat treatment at 1000° C. for 1 hour in an air atmosphere to obtain a platinum wire of Example 3. The nitrogen mass concentration of this platinum wire was 15 ppm. Incidentally, the oxygen mass concentration was 22 ppm. Further, when the contamination of impurity elements in the platinum wire obtained in Example 3 was analyzed by using a GD-MASS analyzer, the contamination of impurity elements was as follows: Cd: 0.1 ppm, Zn: 0.1 ppm, C: 9.1 ppm, Fe: 4.9 ppm, Ru: 7.5 ppm, Cr: 0.8 ppm, Si: 7.2 ppm, Ir: 4.3 ppm, Ni: 0.2 ppm, Rh: 1.2 ppm, Cu: 0.2 ppm, Pd: 1.9 ppm, and Au: 0.2 ppm, the sum of these impurities was 37.7 ppm (mass concentration), and the total amount of impurities including other impurities was 38.9 ppm (mass concentration). Then, for determination of the structure size, the structure observation was performed. FIG. 19 shows an image of a cross section in optical microscope observation and FIG. 20 shows an image of the longitudinal direction in optical microscope observation. In the cross section of FIG. 19, the crystal is approximated to an equiaxial crystal and the crystal becomes coarse. On the other hand, when the longitudinal direction of FIG. 20 is observed, it can be observed that the structure has an extremely large aspect ratio {(length of major axis)/(length of minor axis perpendicular to major axis)}, and the aspect ratio is 5 or more. The aspect ratio was specifically 5.6 as a minimum value. In addition, there was a plurality of crystal grains in the wire thickness direction.

The platinum wire obtained in Example 3 was further subjected to heat treatment at 1000° C. for 1 hour in an air atmosphere (referred to as "platinum wire 3-A"). At this time, the nitrogen mass concentration was 16 ppm. Incidentally, the oxygen mass concentration was 23 ppm. In addition, the structure observation was performed in the similar way. FIG. 21 shows an image of a cross section in optical microscope observation and FIG. 22 shows an image of the longitudinal direction in optical microscope observation. As comparing FIGS. 19 and 20 and FIGS. 21 and 22 with each other, it was found that there is no large change in crystals. The aspect ratio was specifically 5.4 as a minimum value.

The platinum wire obtained in Example 3 was further subjected to heat treatment at 1400° C. for 1 hour in an air atmosphere (referred to as "platinum wire 3-B"). At this time, the nitrogen mass concentration was 15 ppm. Incidentally, the oxygen mass concentration was 20 ppm. In addition, the structure observation was performed in the similar way. FIG. 23 shows an image of a cross section in optical microscope observation and FIG. 24 shows an image of the longitudinal direction in optical microscope observation. As comparing FIGS. 19 and 20, FIGS. 21 and 22, and FIGS. 23 and 24 with one another, it was found that there is no large change in crystals. The slight growth of crystal grains in the wire thickness direction was observed from the longitudinal direction. The aspect ratio was specifically 5.2 as a minimum value.

As comparing the platinum wire, the platinum wire 3-A, and the platinum wire 3-B of Example 3 with one another, the following facts are found. That is, in the case of a polycrystal of general metal, as the heat treatment temperature increases and the heat treatment time increases, there is a tendency that the crystal grains are grown and become large. As comparing three wires with one another, it was found that they are deviated from this tendency, the sizes of the crystal grains are almost the same, and the growth of the crystal grains is suppressed even when the heat treatment is carried out.

Next, the creep rupture time of the platinum wire of Example 3 was measured. The condition was set as follows: 1100° C., 15 MPa, and an air atmosphere. Under this condition, the wire was broken at 15 hours. It was found that the platinum wire of Example 3 has sufficient strength.

A comparison calibration test was carried out using the platinum wire of Example 3 to check the accuracy of the thermocouple. A wire that was paired with the platinum wire was set to Pt-13Rh 0.5 mmϕ. As a result, it was confirmed that the thermocouple sufficiently satisfies the accuracy of Class 1 defined in JIS C 1602:1995.

Example 4

1000 g of platinum powder (platinum purity: 4 N, BET specific surface area: 0.137 $m^2$/g, porous powder, manufactured by FURUYA METAL Co., Ltd.) in which nitrogen is forcibly contained in a chloroplatinic acid solution by using ammonium chloride and hydrazine was prepared. At this time, the nitrogen mass concentration as measured by a gas analyzer was 123 ppm. In addition, the oxygen mass concentration was 173 ppm. This platinum powder was sintered in vacuum by using a spark plasma sintering method to produce a platinum ingot (40 mmϕ×40 mmh). The surface of this ingot was cleaned through machining or chemical treatment using aqua regia to remove the impurities. The nitrogen mass concentration of this platinum ingot was 99 ppm. In addition, the oxygen mass concentration was 56 ppm. Thereafter, the platinum ingot was subjected to hot forging in air, and similarly, the surface of the platinum ingot was cleaned through machining or chemical treatment using aqua regia. The nitrogen mass concentration of this platinum ingot was 18 ppm. In addition, the oxygen mass concentration was 18 ppm. Next, the platinum ingot was subjected to grooved rolling or swaging in air at room temperature. At this time, the nitrogen mass concentration was 30 ppm. In addition, the oxygen mass concentration was 12 ppm. Then, a wire material having a wire diameter of 0.5 mmϕ was prepared by using a wire-drawing machine. At this time, the nitrogen mass concentration of the wire material was 39 ppm. In addition, the oxygen mass concentration was 24 ppm. Next, in order to remove distortion stress at the time of processing, this wire material was subjected to heat treatment at 1000° C. for 1 hour in an air atmosphere to obtain a platinum wire of Example 4. The nitrogen mass concentration of this platinum wire was 39 ppm. Incidentally, the oxygen mass concentration was 24 ppm. Further, when the contamination of impurity elements in the platinum wire obtained in Example 4 was analyzed by using a GD-MASS analyzer, the contamination of impurity elements was as follows: C: 3.8 ppm, Fe: 0.1 ppm, Ru: 0.1 ppm, Si: 0.1 ppm, Ir: 3 ppm, Rh: 3.1 ppm, Pd: 0.3 ppm, and Au: 1.1 ppm, the sum of these impurities was 11.6 ppm (mass concentration), and the total amount of impurities including other impurities was 12.8 ppm (mass concentration). For determination of the structure size, the structure observation was performed. FIG. 25 shows an image of a cross section in optical microscope observation and FIG. 26 shows an image of the longitudinal direction in optical microscope observation. In the cross section of FIG. 25, the crystal is approximated to an equiaxial crystal and the crystal becomes coarse. On the other hand, when the longitudinal direction of FIG. 26 is observed, it can be observed that the structure has an extremely large aspect ratio {(length of major axis)/(length of minor axis perpendicular to major axis)}, and the aspect ratio is 5 or more. The aspect ratio was specifically 17.5 as a minimum value. In addition, there was a plurality of crystal grains in the wire thickness direction.

The platinum wire obtained in Example 4 was further subjected to heat treatment at 1000° C. for 1 hour in an air atmosphere (referred to as "platinum wire 4-A"). At this time, the nitrogen mass concentration was 40 ppm. Incidentally, the oxygen mass concentration was 28 ppm. In addition, the structure observation was performed in the similar way. FIG. 27 shows an image of a cross section in optical microscope observation and FIG. 28 shows an image of the longitudinal direction in optical microscope observation. As comparing FIGS. 25 and 26 and FIGS. 27 and 28 with each other, it was found that there is no large change in crystals. The aspect ratio was specifically 7.3 as a minimum value.

The platinum wire obtained in Example 4 was further subjected to heat treatment at 1400° C. for 1 hour in an air atmosphere (referred to as "platinum wire 4-B"). At this time, the nitrogen mass concentration was 37 ppm. Incidentally, the oxygen mass concentration was 22 ppm. In addition, the structure observation was performed in the similar way. FIG. 29 shows an image of a cross section in optical microscope observation and FIG. 30 shows an image of the longitudinal direction in optical microscope observation. As comparing FIGS. 25 and 26, FIGS. 27 and 28, and FIGS. 29 and 30 with one another, it was found that there is no large change in crystals. The slight growth of crystal grains in the wire thickness direction was observed from the longitudinal direction. The aspect ratio was specifically 6.5 as a minimum value.

As comparing the platinum wire, the platinum wire 4-A, and the platinum wire 4-B of Example 4 with one another, the following facts are found. That is, in the case of a polycrystal of general metal, as the heat treatment temperature increases and the heat treatment time increases, there is a tendency that the crystal grains are grown and become large. As comparing three wires with one another, it was found that they are deviated from this tendency, the sizes of the crystal grains are almost the same, and the growth of the crystal grains is suppressed even when the heat treatment is carried out.

Next, the creep rupture time of the platinum wire of Example 4 was measured. The condition was set as follows: 1100° C., 15 MPa, and an air atmosphere. Under this condition, the wire was not broken even if the time exceeded 503 hours. It was found that the platinum wire of Example 4 has sufficient strength.

A comparison calibration test was carried out using the platinum wire of Example 4 to check the accuracy of the thermocouple. A wire that was paired with the platinum wire was set to Pt-13Rh 0.5 mmϕ. As a result, it was confirmed that the thermocouple sufficiently satisfies the accuracy of Class 1 defined in JIS C 1602:1995.

What is claimed is:

1. A platinum thermocouple wire being used in a negative electrode of a platinum-based thermocouple, wherein
   a nitrogen mass concentration is 10 to 100 ppm, and
   when structure observation of a cross section of the wire in a longitudinal direction is performed, a structure is observed in which there is a plurality of crystal grains, which have an aspect ratio {(length of major axis)/(length of minor axis perpendicular to major axis)} of 5 or more and elongate in the longitudinal direction of the wire, in a wire thickness direction.

2. The platinum thermocouple wire according to claim 1, wherein when the structure of the cross section of the wire in the longitudinal direction is observed after heat treatment at 1400° C. for 1 hour, a structure is observed in which there is a plurality of crystal grains, which have an aspect ratio {(length of major axis)/(length of minor axis perpendicular to major axis)} of 5 or more and elongate in the longitudinal direction of the wire, in the wire thickness direction.

3. The platinum thermocouple wire according to claim 1, wherein the total mass concentration of Cd, Sn, Zn, As, Sb, Pb, Bi, Se, Mo, C, S, P, Fe, Ru, Cr, Si, Ir, Ni, Rh, Cu, Pd, Ag, and Au is 50 ppm or less.

4. The platinum thermocouple wire according to claim 2, wherein the total mass concentration of Cd, Sn, Zn, As, Sb, Pb, Bi, Se, Mo, C, S, P, Fe, Ru, Cr, Si, Ir, Ni, Rh, Cu, Pd, Ag, and Au is 50 ppm or less.

* * * * *